(12) United States Patent
Ko et al.

(10) Patent No.: US 7,646,068 B2
(45) Date of Patent: Jan. 12, 2010

(54) STRUCTURE AND METHOD OF A STRAINED CHANNEL TRANSISTOR AND A SECOND SEMICONDUCTOR COMPONENT IN AN INTEGRATED CIRCUIT

(75) Inventors: Chih-Hsin Ko, Kaohsiung (TW); Wen-Chin Lee, Hsin-Chu (TW); Yee-Chia Yeo, Hsin-Chu (TW); Chun-Chieh Lin, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 11/483,913

(22) Filed: Jul. 10, 2006

(65) Prior Publication Data

US 2006/0255365 A1 Nov. 16, 2006

Related U.S. Application Data

(62) Division of application No. 10/729,095, filed on Dec. 5, 2003, now Pat. No. 7,112,495.

(60) Provisional application No. 60/497,819, filed on Aug. 26, 2003, provisional application No. 60/495,584, filed on Aug. 15, 2003.

(51) Int. Cl.
  *H01L 29/76* (2006.01)
  *H01L 29/00* (2006.01)
(52) U.S. Cl. .......................... 257/379; 257/536
(58) Field of Classification Search .............. 257/350, 257/379, 536, 537, E21.431, E21.438, E27.016; 438/200, 210
See application file for complete search history.

(56) References Cited

U.S. PATENT DOCUMENTS

| 4,069,094 A | 1/1978 | Shaw et al. |
| 4,314,269 A | 2/1982 | Fujiki |
| 4,497,683 A | 2/1985 | Celler et al. |
| 4,631,803 A | 12/1986 | Hunter et al. |
| 4,892,614 A | 1/1990 | Chapman et al. |

(Continued)

FOREIGN PATENT DOCUMENTS

EP   0 683 522 A2   11/1995

(Continued)

OTHER PUBLICATIONS

Ismail K, et al., "Electron Transport Properties of Si/SiGe Heterostructures: Measurements and Device Implications." Applied Physics Letters, vol. 63, No. 5, (Aug. 2,1993), pp. 660-682.

(Continued)

*Primary Examiner*—Hung Vu
(74) *Attorney, Agent, or Firm*—Slater & Matsil, L.L.P.

(57) ABSTRACT

A semiconductor chip includes a semiconductor substrate 126, in which first and second active regions are disposed. A resistor 124 is formed in the first active region and the resistor 124 includes a doped region 128 formed between two terminals 136. A strained channel transistor 132 is formed in the second active region. The transistor includes a first and second stressor 141, formed in the substrate oppositely adjacent a strained channel region 143.

20 Claims, 15 Drawing Sheets

U.S. PATENT DOCUMENTS

| | | |
|---|---|---|
| 4,946,799 A | 8/1990 | Blake et al. |
| 4,952,993 A | 8/1990 | Okumura |
| 5,130,773 A | 7/1992 | Tsukada |
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,525,828 A | 6/1996 | Bassous et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |
| 5,763,315 A | 6/1998 | Benedict et al. |
| 5,789,807 A | 8/1998 | Correale, Jr. |
| 5,811,857 A | 9/1998 | Assaderaghi et al. |
| 5,955,766 A | 9/1999 | Ibi et al. |
| 5,965,917 A | 10/1999 | Maszara et al. |
| 5,972,722 A | 10/1999 | Visokay et al. |
| 6,008,095 A | 12/1999 | Gardner et al. |
| 6,015,990 A | 1/2000 | Hieda et al. |
| 6,015,993 A | 1/2000 | Voldman et al. |
| 6,027,988 A | 2/2000 | Cheung et al. |
| 6,046,487 A | 4/2000 | Benedict et al. |
| 6,059,895 A | 5/2000 | Chu et al. |
| 6,096,591 A * | 8/2000 | Gardner et al. ............... 438/238 |
| 6,100,153 A | 8/2000 | Nowak et al. |
| 6,100,204 A * | 8/2000 | Gardner et al. ............... 438/765 |
| 6,103,599 A | 8/2000 | Henley et al. |
| 6,107,125 A | 8/2000 | Jaso et al. |
| 6,111,267 A | 8/2000 | Fischer et al. |
| 6,190,996 B1 | 2/2001 | Mouli et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,303,479 B1 | 10/2001 | Snyder |
| 6,339,232 B1 | 1/2002 | Takagi |
| 6,358,791 B1 | 3/2002 | Hsu et al. |
| 6,387,739 B1 | 5/2002 | Smith, III |
| 6,407,406 B1 | 6/2002 | Tezuka |
| 6,413,802 B1 | 7/2002 | Hu et al. |
| 6,414,355 B1 | 7/2002 | An et al. |
| 6,420,218 B1 | 7/2002 | Yu |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,215 B2 | 12/2002 | Mouli et al. |
| 6,489,664 B2 | 12/2002 | Re et al. |
| 6,489,684 B1 | 12/2002 | Chen et al. |
| 6,495,900 B1 | 12/2002 | Mouli et al. |
| 6,498,359 B2 | 12/2002 | Schmidt et al. |
| 6,518,610 B2 | 2/2003 | Yang et al. |
| 6,521,952 B1 | 2/2003 | Ker et al. |
| 6,524,905 B2 | 2/2003 | Yamamichi et al. |
| 6,525,403 B2 | 2/2003 | Inaba et al. |
| 6,541,343 B1 | 4/2003 | Murthy et al. |
| 6,555,839 B2 | 4/2003 | Fitzgerald |
| 6,558,998 B2 | 5/2003 | Belleville et al. |
| 6,573,172 B1 | 6/2003 | En et al. |
| 6,576,526 B2 | 6/2003 | Kai et al. |
| 6,586,311 B2 | 7/2003 | Wu |
| 6,600,170 B1 | 7/2003 | Xiang |
| 6,617,643 B1 | 9/2003 | Goodwin-Johansson |
| 6,621,131 B2 | 9/2003 | Murthy et al. |
| 6,633,070 B2 | 10/2003 | Miura et al. |
| 6,646,322 B2 | 11/2003 | Fitzgerald |
| 6,853,700 B1 | 11/2003 | Chau et al. |
| 6,657,259 B2 | 12/2003 | Fried et al. |
| 6,657,276 B1 | 12/2003 | Karlsson et al. |
| 6,674,100 B2 | 1/2004 | Kubo et al. |
| 6,686,247 B1 | 2/2004 | Bohr |
| 6,690,082 B2 * | 2/2004 | Lakshmikumar ............ 257/536 |
| 6,720,619 B1 | 4/2004 | Chen et al. |
| 6,724,019 B2 | 4/2004 | Oda et al. |
| 6,737,710 B2 | 5/2004 | Cheng et al. |
| 6,740,535 B2 | 5/2004 | Singh et al. |
| 6,759,717 B2 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B2 | 9/2004 | Murthy et al. |
| 6,798,021 B2 | 9/2004 | Ipposhi et al. |
| 6,803,641 B2 | 10/2004 | Papa Rao et al. |
| 6,812,103 B2 | 11/2004 | Wang et al. |
| 6,821,840 B2 | 11/2004 | Wieczorek et al. |
| 6,867,101 B1 | 3/2005 | Yu |
| 6,872,610 B1 | 3/2005 | Mansoori et al. |
| 6,885,084 B2 | 4/2005 | Murthy et al. |
| 6,891,192 B2 | 5/2005 | Chen et al. |
| 6,924,181 B2 | 8/2005 | Huang et al. |
| 6,969,618 B2 | 11/2005 | Mouli |
| 7,081,395 B2 | 7/2006 | Chi et al. |
| 2001/0028089 A1 | 10/2001 | Adan |
| 2002/0008289 A1 | 1/2002 | Murota et al. |
| 2002/0031890 A1 | 3/2002 | Watanabe et al. |
| 2002/0045318 A1 | 4/2002 | Chen et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0153549 A1 | 10/2002 | Leibowitz et al. |
| 2002/0163036 A1 | 11/2002 | Miura et al. |
| 2002/0190284 A1 | 12/2002 | Murthy et al. |
| 2003/0001219 A1 | 1/2003 | Chau et al. |
| 2003/0030091 A1 | 2/2003 | Bulsara et al. |
| 2003/0080386 A1 | 5/2003 | Ker et al. |
| 2003/0080388 A1 | 5/2003 | Disney et al. |
| 2003/0098479 A1 | 5/2003 | Murthy et al. |
| 2003/0136985 A1 | 7/2003 | Murthy et al. |
| 2003/0183880 A1 * | 10/2003 | Goto et al. .................. 257/379 |
| 2004/0016972 A1 | 1/2004 | Singh et al. |
| 2004/0026765 A1 | 2/2004 | Currie et al. |
| 2004/0070035 A1 | 4/2004 | Murthy et al. |
| 2004/0087098 A1 | 5/2004 | Ng et al. |
| 2004/0140506 A1 | 7/2004 | Singh et al. |
| 2004/0173815 A1 | 9/2004 | Yeo et al. |
| 2004/0179391 A1 | 9/2004 | Bhattacharyya |
| 2004/0217448 A1 | 11/2004 | Kumagai et al. |
| 2004/0262683 A1 | 12/2004 | Bohr et al. |
| 2004/0266116 A1 | 12/2004 | Mears et al. |
| 2005/0029601 A1 | 2/2005 | Chen et al. |
| 2005/0121727 A1 | 6/2005 | Ishitsuka et al. |
| 2005/0224986 A1 | 10/2005 | Tseng et al. |
| 2005/0224988 A1 | 10/2005 | Tuominen |
| 2005/0236694 A1 | 10/2005 | Wu et al. |
| 2006/0001073 A1 | 1/2006 | Chen et al. |

FOREIGN PATENT DOCUMENTS

| EP | 0 828 296 A2 | 3/1998 |
|---|---|---|
| WO | WO 03/017336 A2 | 2/2003 |

OTHER PUBLICATIONS

Nayak, D.K., et al., "Enhancement-Mode Quantum-Well $Ge_xSi_{1-x}$ PMOS," IEEE Electron Device Letters, vol. 12, No. 4, (Apr. 1991), pp. 154-156.

Gámiz, F.. et al., "Strained-SI/SiGe-on-Insulator Inversion Layers: The Role of Strained-Si Layer Thickness on Electron Mobility." Applied Physics Letters, vol. 80, No. 22, (Jun. 3, 2002), pp. 4160-4162.

Gámiz, F., et al., "Electron Transport in Strained Si Inversion Layers Grown on SiGe-on-Insulator Substrates," Journal of Applied Physics, vol. 92, No. 1, (Jul. 1, 2002), pp. 288-295.

Mizuno, T., et al., "Novel SOI p-Channel MOSFETs With Higher Strain in Si Channel Using Double SiGe Heterostructures," IEEE Transactions on Electron Devices, vol. 49, No. 1, (Jan. 2002), pp. 7-14.

Tezuka, T., et al., "High-Performance Strained Si-on-Insulator MOSFETs by Novel Fabrication Processes Utilizing Ge-Condensation Technique," Symposium On VLSI Technology Digest of Technial Paper, (2002), pp. 96-97.

Jurczak, M., et al., "Silicon-on-Nothing (SON)—an Innovative Process for Advanced CMOS," IEEE Transactions on Electron Devices, vol. 47, No. 11, (Nov. 2000), pp. 2179-2187.

Jurczak, M., et al., "SON (Silicon on Nothing)—A New Device Architecture for the ULSI Era," Symposium on VLSI Technology Digest of Technical Papers, (1999), pp. 29-30.

Maiti, C.K., et al., "Film Growth and Material Parameters," Application of Silicon-Germanium Heterostructure, Institute of Physics Publishing, Ch. 2 (2001) pp. 32-42.

Tiwari, S., et al., "Hole Mobility Improvement in Silicon-on-Insulator and Bulk Silicon Transistors Using Local Strain," International Electron Device Meeting, (1997), pp. 939-941.

Ootsuka, F., et al., "A Highly Dense, High-Performance 130nm Node CMOS Technology for Large Scale System-on-a-Chip Applications," International Electron Device Meeting, (2000), pp. 575-878.

Matthews, J.W., et al., "Defects in Epitaxial Multilayers—I. Misfit Dislocations," Journal of Crystal Growth, vol. 27, (1974), pp. 118-125.

Matthews. J.W., et al., "Defects in Epitaxial Multilayers—II. Dislocation Pile-Ups, Threading Dislocations, Slip Lines and Cracks," Journal of Crystal Growth, vol. 29, (1975). pp. 273-280.

Matthews, J.W., et al., "Defects in Epitaxial Multilayers—III, Preparation of Almost Perfect Multilayers," Journal of Crystal Growth, vol. 32, (1976), pp. 286-273.

Schoppen, A., et al., "Mesa and Planar SiGe-HBTs on MBE-Wafers," Journal of Materials Science: Materials in Electronics, vol. 6, (1995), pp. 298-305.

Matthews, J. W., "Defects Associated with the Accommodation of Misfit Between Crystals," J. Vac. Sci. Technol., vol. 12, No. 1 (Jan./Feb. 1975), pp. 126-133.

Huang, X., et al., "Sub-50 nm P-Channel FinFET," IEEE Transactions on Electron Devices, vol. 48. No. 5, May 2001, pp. 880-886.

Shahidi, G.G., "SOI Technology for the GHz Era." IBM J. Res. & Dev., vol. 46, No. 2/3, Mar./May 2002, pp. 121-131.

Shimizu, A., et al., "Local Mechanical Stress Control (LMC): A New Technique for CMOS-Performance Enhancement," IEDM 2001, pp. 433-436.

Wong, H.-S.P., "Beyond the Conventional Transistor." IBM J. Res. & Dev., vol. 46, No. 2/3, Mar./May 2002, pp. 133-167.

Yang, F.L., et al., "25 nm CMOS Omega FETs," IEDM 2002, pp. 255-258.

Yang, F.L., et al, "35nm CMOS FinFETs," 2002 Symposium on VLSI Technology Digest of Technical Papers, 2002, pp. 104-105.

Thompson, S., et al., "A 90 nm Logic Technology Featuring 50nm Strained Silicon Channel Transistors, 7 Layers of Cu Interconnects, Low k ILD, and 1 $um^2$ SRAM Cell," IEDM, pp. 61-64.

Welser, J., et al., "NMOS and PMOS Transistors Fabricated in Strained Silicon/Relaxed Silicon-Germanium Structures," IEDM 1992, pp. 1000-1002.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Yeoh, J.C., et al., "MOS Gated Si:SiGe Quantum Wells Formed by Anodic Oxidation," Semicond. Sci. Technol. (1998), vol. 13, pp. 1442-1445, IOP Publishing Ltd., UK.

Cavassilas, N., et al., "Capacitance-Voltage Characteristics of Metal-Oxide-Strained Semiconductor SI/SiGe Heterostructures," Nanotech 2002, vol. 1, pp. 600-603.

Blaauw, D., et al.,"Gate Oxide and Subthreshold Leakage Characterisation, Analysis and Optimization," date unknown.

"Future Gate Stack," International Sematech. 2001 Annual Report.

Chang, L., et al., "Reduction of Direct-Tunneling Gate Leakage Current in Double-Gate and Ultra-Thin Body MOSFETs," 2001 IEEE, Berkeley, CA.

Chang, L, et al., "Direct-Tunneling Gate Leakage Current in Double-Gate and Ultrathin Body MOSFETs," 2002 IEEE, vol. 49, No. 12, Dec. 2002.

Leitz, C.W., et al., "Channel Engineering of SiGe-Based Heterostructures for High Mobility MOSFETs," Materials Research Society Symposium Proceedings, vol. 686, (2002), pp. 113-118.

Leitz, C.W., et al.. "Hole mobility enhancements in strained $SI/SI_{1-y}Ge_y$ p-type metal-oxide-semiconductor field-effect transistors grown on relaxed $Si_{1-x}Ge_x$ (x<y) virtual substrates," Applied Physics Letters. vol. 79, No. 25, pp. 4246-4248, Dec. 17, 2001.

Liu, K.C., et al., "A Novel Sidewall Strained-Si Channel nMOSFET," IEDM, (1999) pp. 63-66.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration. Lattice Press, Sunset Beach, California, 1990, pp. 144-145.

Wolf, S., et al., "Silicon Processing For The VLSI Era," vol. I: Process Technology Second Addition, Lattice Press, Sunset Beach, CA, pp. 374-385.

Wolf, S., "Silicon Processing For the VLSI Era," vol. 2: Process Integration, Lattice Press, Sunset Beach, CA, pp. 658-663.

* cited by examiner

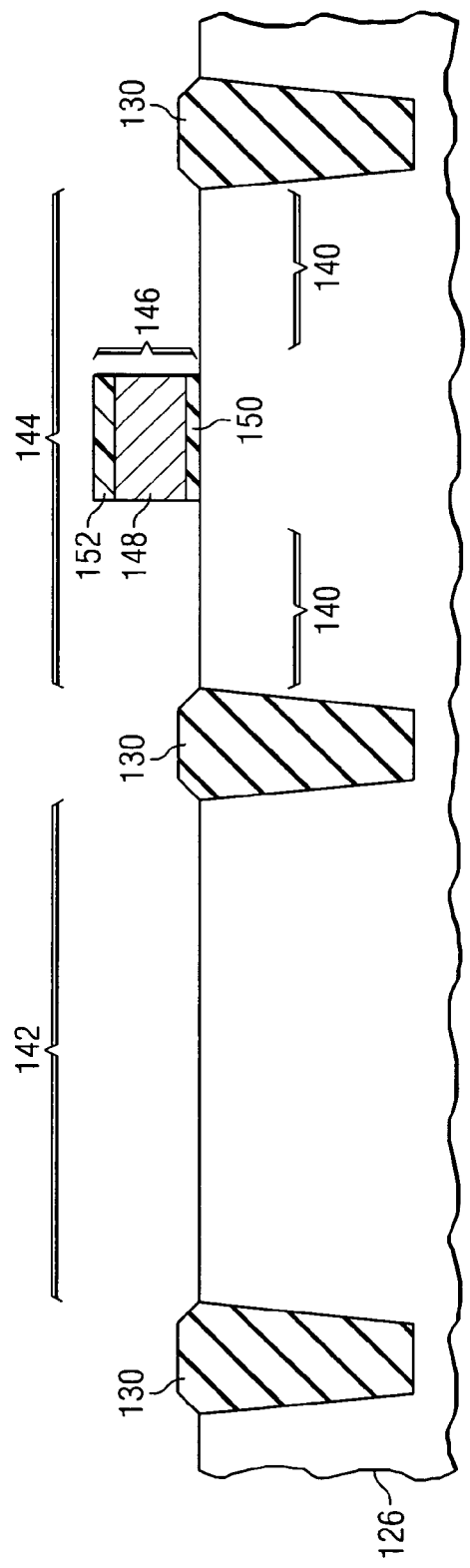
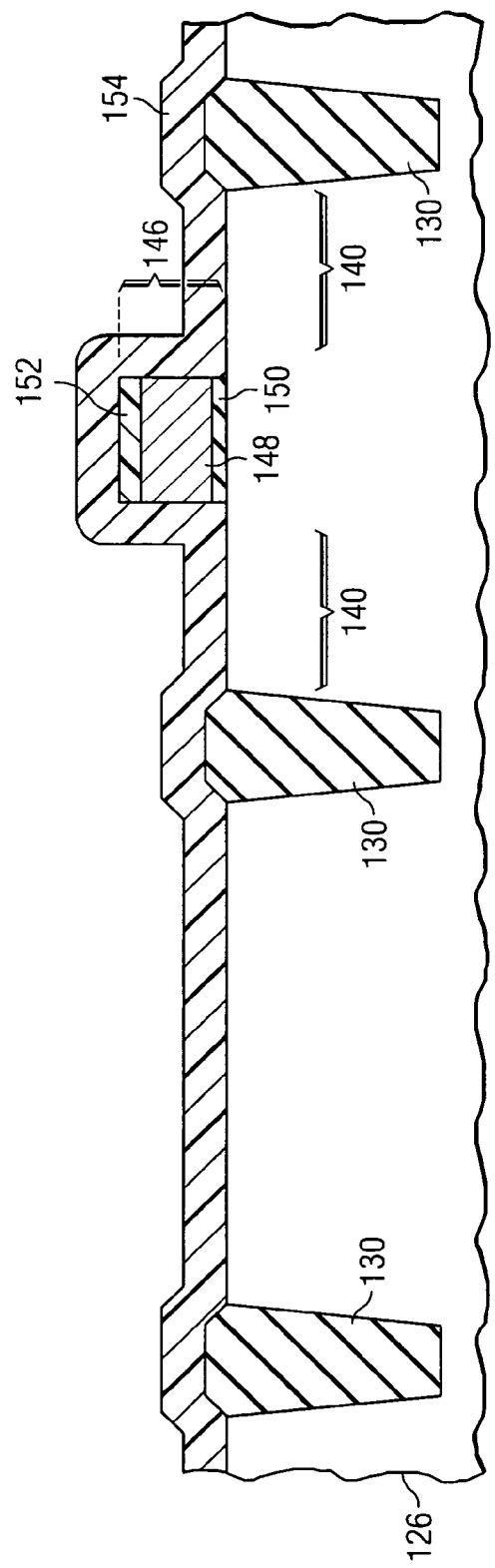

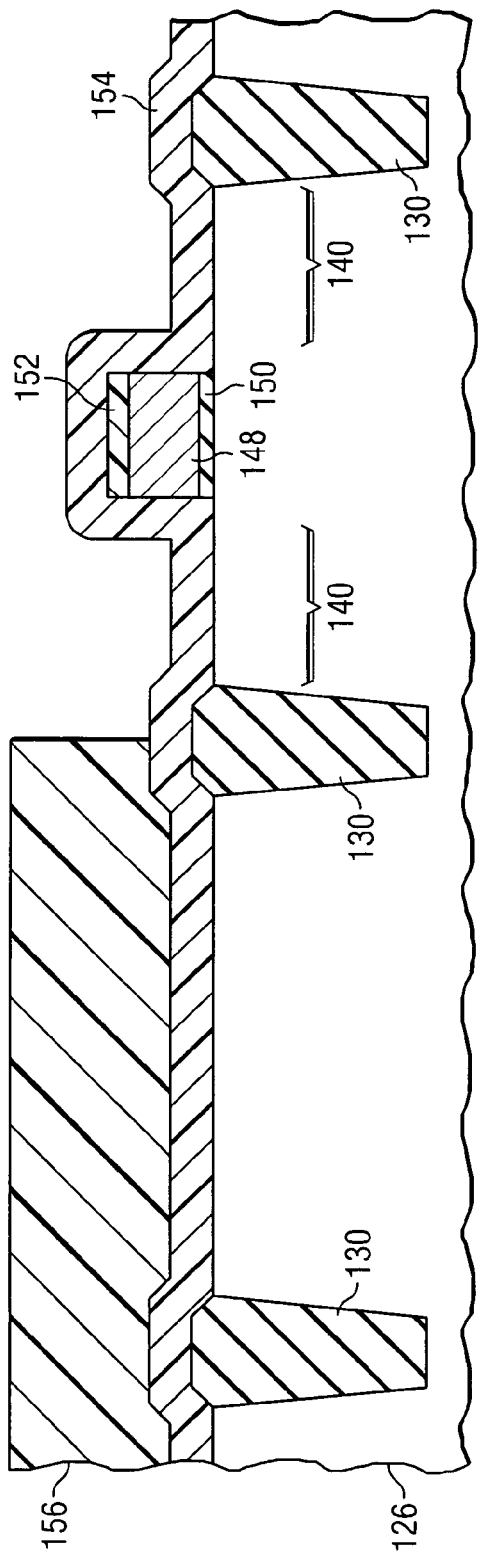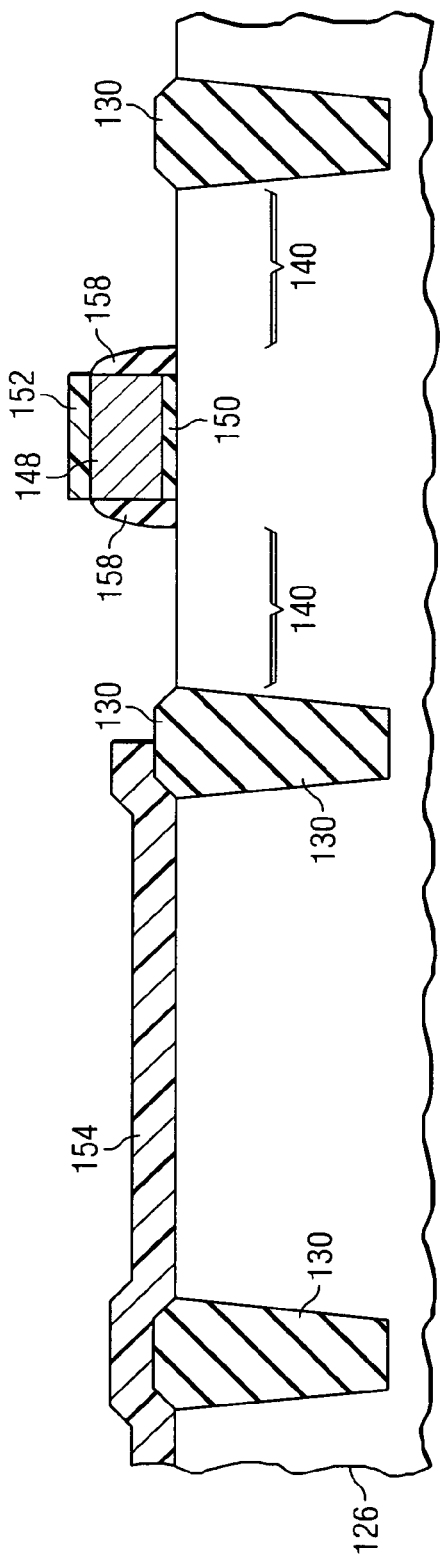

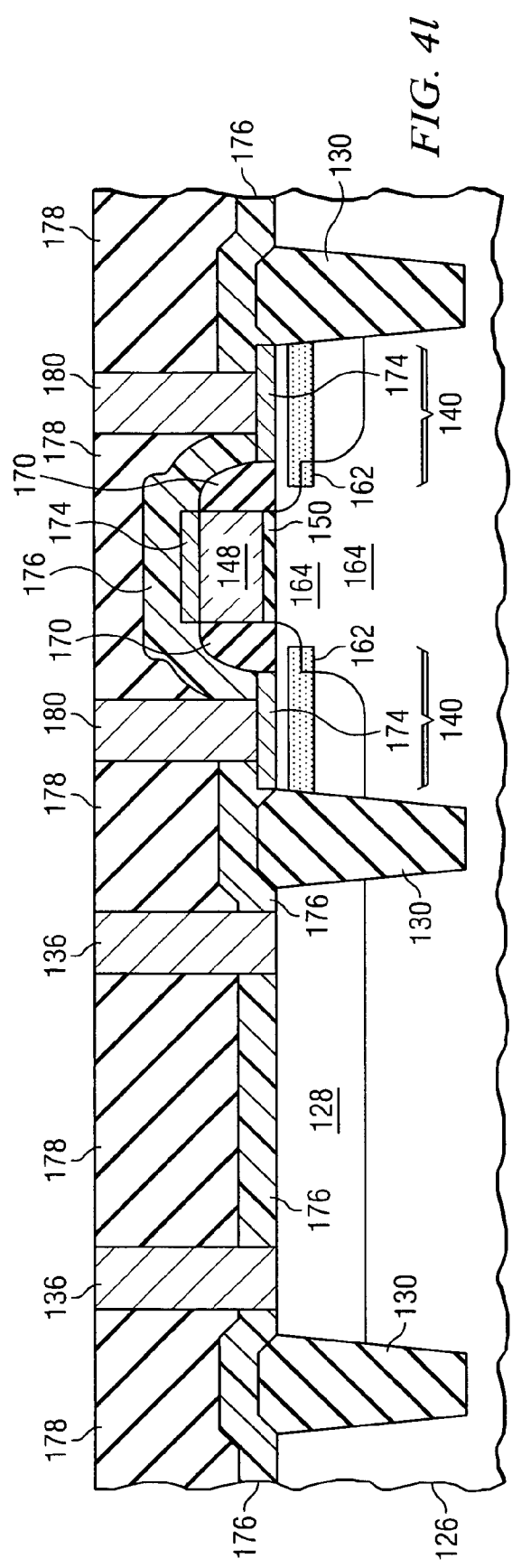

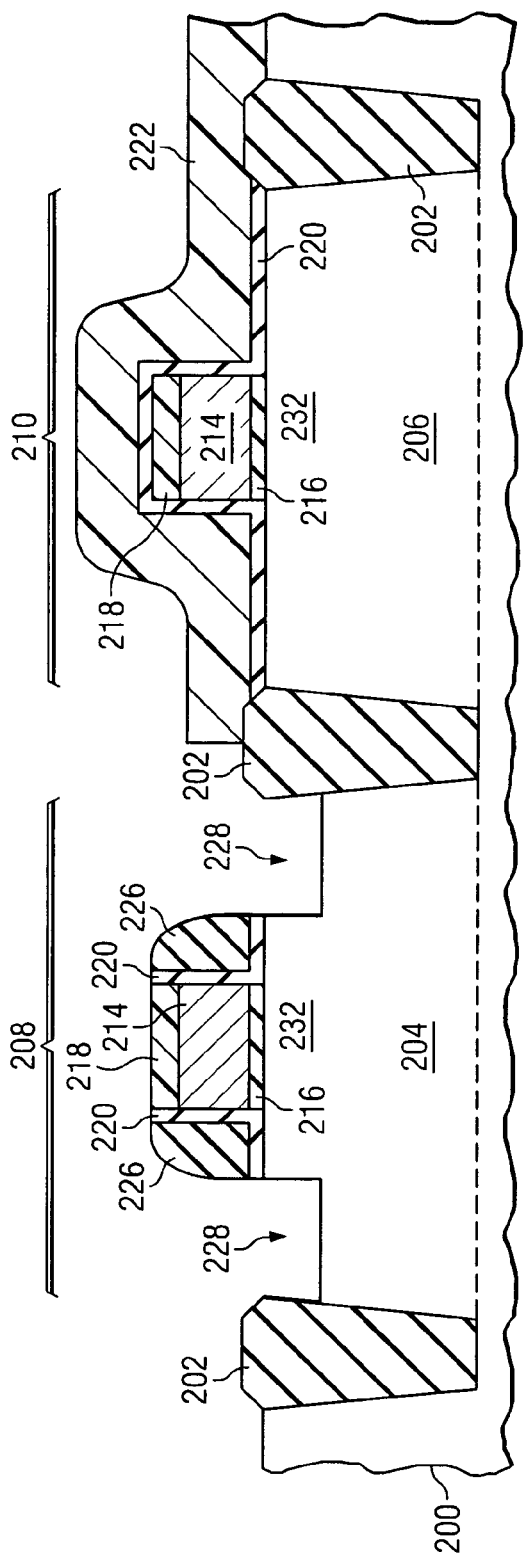
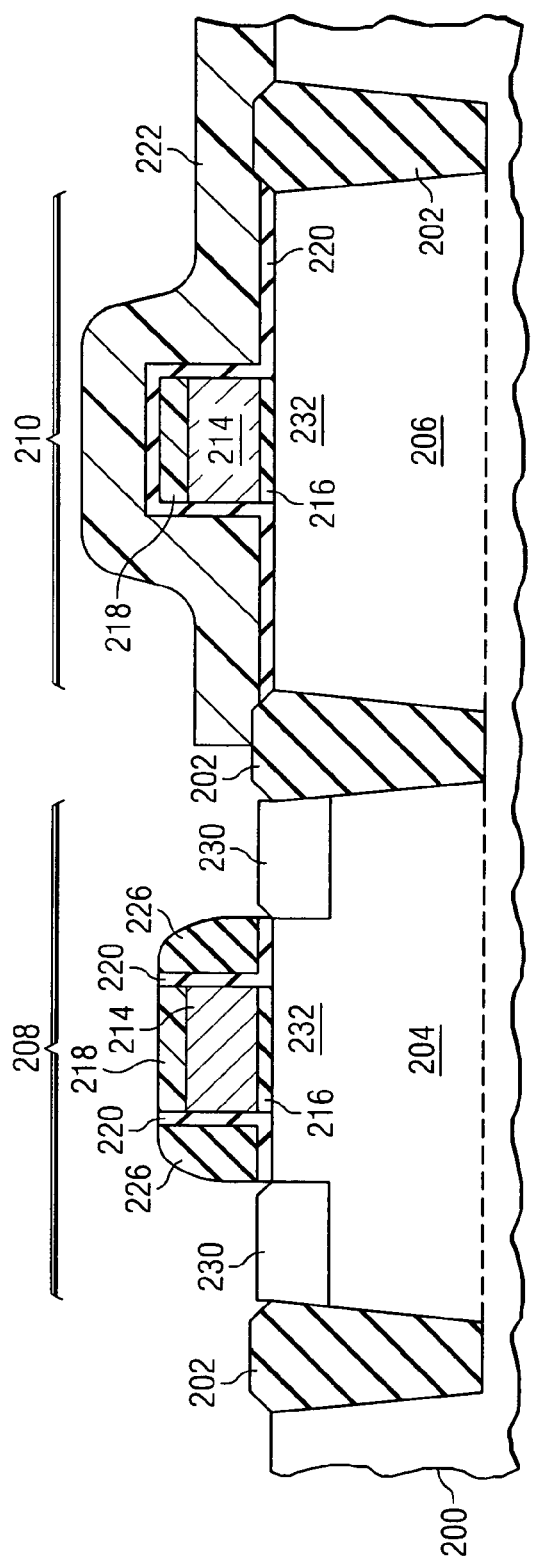

STRUCTURE AND METHOD OF A STRAINED CHANNEL TRANSISTOR AND A SECOND SEMICONDUCTOR COMPONENT IN AN INTEGRATED CIRCUIT

This application is a divisional of U.S. patent application Ser. No. 10/729,095, entitled "Structure and Method of a Strained Channel Transistor and a Second Semiconductor Component in an Integrated Circuit," filed on Dec. 5, 2003, now U.S. Pat. No. 7,112,495, which application claims the benefit of U.S. Provisional Application Ser. No. 60/497,819 filed on Aug. 26, 2003, and U.S. Provisional Application Ser. No. 60/495,584 filed on Aug. 15, 2003, which applications are hereby incorporated herein by reference.

CROSS-REFERENCE TO RELATED APPLICATIONS

The following U.S. Patents and/or commonly assigned patent applications are hereby incorporated herein by reference:

| Patent or Ser. No. | Filing Date | Issue Date | Attorney Docket No. |
| --- | --- | --- | --- |
| 6,921,913 | Feb. 28, 2003 | Jul. 26, 2005 | TSM03-0050 |
| 10/667,871 | Sep. 22, 2003 | — | TSM03-0553 |
| 10/641,813 | Aug. 15, 2003 | — | TSM03-0554 |
| 6,936,881 | Jul. 25, 2003 | Aug. 30, 2005 | TSM03-0555 |
| 6,940,705 | Jul. 25, 2003 | Sep. 6, 2005 | TSM03-0556 |
| 10/729,092 | Dec. 5, 2003 | — | TSM03-0670 |

TECHNICAL FIELD

The present invention relates generally to semiconductor devices, and more particularly, the preferred embodiment relates to strained channel complementary field-effect transistors and methods of manufacture.

BACKGROUND

Size reduction of metal-oxide-semiconductor field-effect transistors (MOSFET), including reduction of the gate length and gate oxide thickness, has enabled the continued improvement in speed performance, density, and cost per unit function of integrated circuits over the past few decades. To enhance transistor performance further, strain may be introduced in the transistor channel for improving carrier mobilities. Therefore, strain-induced mobility enhancement is another way to improve transistor performance in addition to device scaling. There are several existing approaches of introducing strain in the transistor channel region.

In one conventional approach, as described in a paper by J. Welser et al., published at the December 1992 International Electron Devices Meeting held in San Francisco, Calif., pp. 1000-1002 and incorporated herein by reference, a relaxed silicon germanium (SiGe) buffer layer is provided beneath the channel region. In such a device, a semiconductor device includes a strained silicon layer formed over and abutting a relaxed SiGe layer, which is formed over and abutting a graded SiGe buffer layer.

The relaxed SiGe layer has a larger lattice constant compared to relaxed Si, and the thin layer of epitaxial Si grown on the relaxed SiGe will have its lattice stretched in the lateral direction, i.e., it will be under biaxial tensile strain. Therefore, a transistor formed on the epitaxial strained silicon layer will have a channel region that is under biaxial tensile strain. In this approach, the relaxed SiGe buffer layer can be thought of as a stressor that introduces strain in the channel region. The stressor, in this case, is placed below the transistor channel region.

Significant mobility enhancement has been reported for both electrons and holes in bulk transistors using a silicon channel under biaxial tensile strain. In the above-mentioned approach, the epitaxial silicon layer is strained before the formation of the transistor. But there are concerns about the strain relaxation upon subsequent CMOS processing where high temperatures are used. In addition, this approach is very expensive since a SiGe buffer layer with thickness in the order of micrometers has to be grown. Numerous dislocations in the relaxed SiGe buffer layer exist and some of these dislocations propagate to the strained silicon layer, resulting in a substrate with high defect density. Thus, this approach has limitations that are related to cost and fundamental material properties.

In another approach, strain in the channel is introduced after the transistor is formed. In this approach, a high stress film is formed over a completed transistor structure formed in a silicon substrate. The high stress film or stressor exerts significant influence on the channel, modifying the silicon lattice spacing in the channel region, and thus introducing strain in the channel region. In this case, the stressor is placed above the completed transistor structure. This scheme is described in detail in a paper by A. Shimizu et al., entitled "Local mechanical stress control (LMC): a new technique for CMOS performance enhancement," published in pp. 433-436 of the Digest of Technical Papers of the 2001 International Electron Device Meeting, which is incorporated herein by reference.

The strain contributed by the high stress film is believed to be uniaxial in nature with a direction parallel to the source-to-drain direction. However, uniaxial tensile strain degrades hole mobility while uniaxial compressive strain degrades the electron mobility. Ion implantation of germanium can be used to selectively relax the strain so that the hole or electron mobility is not degraded, but this is difficult to implement due to the close proximity of the n and p-channel transistors.

Accordingly, what is needed in the art is an improved transistor and method thereof that addresses the above-discussed issues.

SUMMARY OF THE INVENTION

Preferred embodiments of the present invention teach a strained channel transistor and another component formed on the same semiconductor substrate. In a first embodiment, the other component is a resistor. In another embodiment, the other component is a transistor. In other embodiments, the other component can be other devices.

In one aspect, the invention teaches a method of forming a conventional resistor and a strained channel transistor on the same substrate using the same process flow. A stressor can be defined as that which introduces strain in the transistor channel region. In prior art, schemes of inducing strain in transistors introduce the strain with a stressor, benefiting transistors of the first conduction type while degrading transistors of the second conduction type.

In accordance with a preferred embodiment of the present invention, a semiconductor chip comprises a semiconductor substrate in which first and second active regions are disposed. A resistor is formed in the first active region; the resistor including a doped region is formed between two terminals. A strained channel transistor is formed in the second active region. The transistor comprises a first and second stressor formed in the substrate oppositely adjacent a strained channel region.

In accordance with another preferred embodiment of the present invention, a semiconductor chip is formed in a semiconductor region with a first semiconductor material with a natural lattice constant forming a first and second active regions in the semiconductor region. A gate stack is formed over the second active region and a masking layer is formed over the first active region. After forming the masking layer, at least one recess is formed in a portion of the second active region not covered by the gate stack. A second semiconductor material is grown in the recesses, the second semiconductor material having a second natural lattice constant that is different than the first natural lattice constant. Source and drain regions are formed in the second active region to form a strained channel transistor. The masking layer is removed and a semiconductor component is formed in the first active region.

In accordance with another preferred embodiment of the present invention, a semiconductor device is formed in a semiconductor substrate with a first semiconductor material. The substrate includes a first active region having a first gate stack and a second active region having a second gate stack. A film is formed over the first and second active regions and spacers are formed on sidewalls of the second gate stack in the second active region. Source and drain recesses are etched on opposing sides of the second gate stack and are spaced from a channel region by the spacers. A second semiconductor material is grown in the source and drain recesses.

In accordance with another preferred embodiment of the present invention, a semiconductor device is formed by the means of providing a semiconductor layer that includes a first active region and a second active region. A first gate stack is formed over the first active region and a second gate stack is formed over the second active region. A dielectric film is formed over the first and second active regions and a masking layer is formed over a portion of the dielectric film overlying the second active region. Disposable spacers are formed on sidewalls of the first gate stack by anisotropically etching the dielectric film. First and second recesses are formed in the first active region, and are substantially aligned with the disposable spacer. The first and second recesses are filled with a semiconductor material and the source and drain regions in the second active region adjacent the second gate stack are implanted.

BRIEF DESCRIPTION OF THE DRAWINGS

For a more complete understanding of the present invention, and the advantages thereof, reference is now made to the following descriptions taken in conjunction with the accompanying drawing, in which:

FIGS. 4a-4l show a first embodiment process flow;

FIG. 5 compares a conventional PMOS and a compressive stressed PMOS;

FIG. 6 compares a conventional NMOS and a compressive stressed NMOS;

FIGS. 7-12 show combined steps of the second and third embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Resistors are commonly used in semiconductor integrated circuits. Resistors are used, for example, in analog and in mixed mode analog and digital circuits. Resistors are also used in input and output circuits as input and output resistors. In addition, resistors are sometimes used as part of an input protection circuit to provide protection of the circuit against electrostatic discharge (ESD) events. In this case, the resistor is used to attenuate the ESD voltage and to absorb and dissipate ESD energy. Large voltages in the order of thousands of volts may appear across the two terminals of the resistor used for ESD applications.

Figure 1:
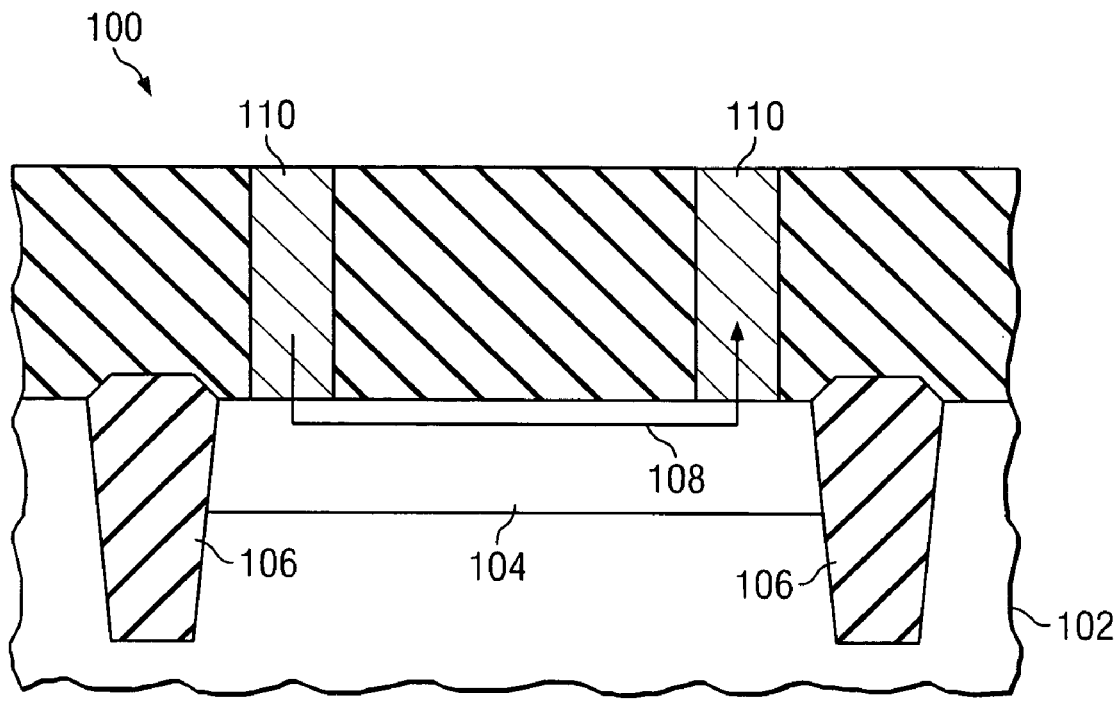
FIG. 1 shows a conventional resistor formed in a portion of substrate.

Resistors in integrated circuits may be formed using a poly-crystalline silicon layer, for example. Resistors in integrated circuits may also be formed on a single-crystalline silicon layer, e.g., resistors may be formed in a portion of the single crystal silicon bulk substrate, or in a portion of a single crystal silicon layer in a silicon-on-insulator substrate. As an example, a resistor 100 formed in a portion of a single crystal silicon substrate 102 is shown in FIG. 1. The resistor body 104 is doped with a type opposite the substrate 102, and is defined by an isolation structure 106 such as shallow trench isolation, for example. Current 108 flows through the resistor body 104 between two terminals 110 of the resistor 100, as shown in FIG. 1. In the resistor body 104, the current 108 experiences a linear current-voltage relationship characteristically defined as resistance. It is known to one skilled in the art that resistors with a resistor body comprising a single-crystalline semiconductor have the characteristics of high stability and low noise in comparison with conventional poly-crystalline resistor structures.

In the preferred embodiment, a structure and method of forming a resistor and a strained channel transistor is provided. Methods of forming such resistors with strained channel transistors are provided.

Figure 2:
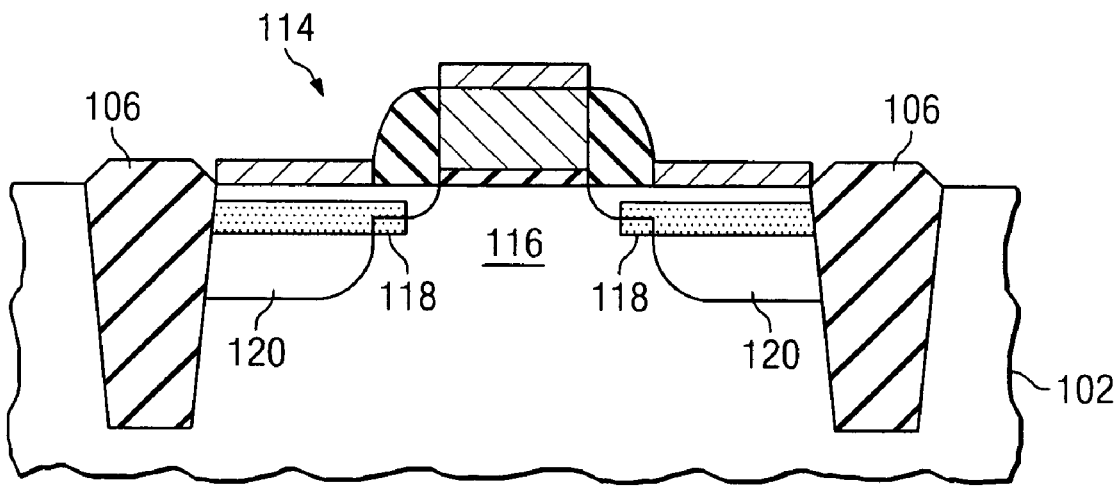
FIG. 2 shows a strained channel transistor.

FIG. 2 shows a strained channel transistor 114 where a first semiconductor material in the channel region 116 is stressed by the placement of a second semiconductor material 118 in a part of the source and drain regions 120. The second semiconductor material may also form part of the channel region 116. The lattice constant of the second semiconductor material varies in relation to the lattice constant of the first semiconductor material such that a strain is placed on the first semiconductor material in the channel region. The second semiconductor material will be hereon referred to as a stressor. The transistor 114 comprising a strained channel region 118 is commonly known as a strained channel transistor. When the lattice constant of the stressor (e.g., $Si_{1-x}Ge_x$) is larger than that of the first semiconductor material (e.g., Si), the stressor results in a compressive strain in the source-to-drain direction of the transistor. When the lattice constant of the second semiconductor material (e.g., $Si_{1-y}C_y$) is smaller than that of the first semiconductor material (e.g., Si), the stressor results in a tensile strain in the source-to-drain direction of the transistor. Details of this strained channel transistor are given in co-pending patent application, Y. -C. Yeo et al., "Strained-channel transistor with a lattice-mismatched zone in the source/drain regions," U.S. patent application Ser. No. 10/379,033, filed Mar. 4, 2003, and is incorporated herein by reference.

In the preferred embodiment, the first semiconductor material is silicon (Si) and the second semiconductor material is silicon-germanium (SiGe or $Si_{1-x}Ge_x$), and the strained channel transistor is a p-channel transistor. The mole fraction x of Ge in SiGe may be in the range of about 0.1 to about 0.9. In another embodiment, where the strained channel transistor is an n-channel transistor, the first semiconductor material is silicon, the second semiconductor material is silicon-carbon (SiC or $Si_{1-y}C_y$), and the mole fraction y of C in SiC may be in the range of about 0.01 to about 0.04. While $Si_{1-x}Ge_x$ and $Si_{1-y}C_y$ may be used as the second semiconductor layer, other semiconductor materials may be used. For example, a semiconductor alloy such as $Si_{1-x-y}Ge_xC_y$ may be used as the second semiconductor layer.

Figure 3:
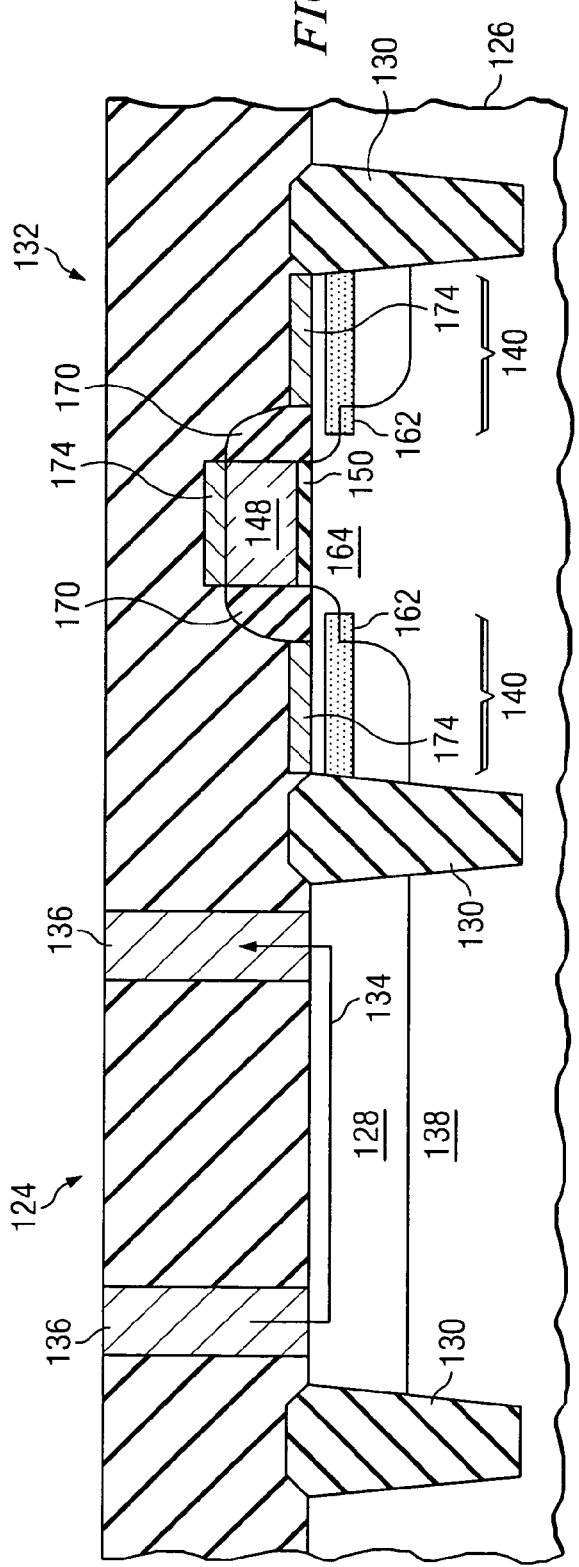
FIG. 3 shows the integration of a strained channel transistor and a conventional resistor.

The first embodiment of the present invention will be described with respect to a specific context, namely a method of integrating a conventional resistor such as the resistor with a strained channel transistor. In FIG. 3, a conventional resistor 124 is formed in a portion of the substrate 126 in a first active region 138 defined by isolation regions 130, and a strained channel transistor 132 is formed in another portion of the substrate 126.

The resistor 124 comprises a doped resistor body 128 through which current 134 flows between two resistor terminals 136. The current 136 flowing in the resistor body 128 experiences a resistance, the value of which is a function of many parameters, e.g., the doping type, doping concentration, layout, and size of the resistor body. The doping type of the doped resistor body 128 is opposite the doping type of the semiconductor region 126 immediately underlying the body 128. For example, the resistor 124 may comprise a p+ doped resistor body 128 formed over an n-type doped region 138. The n-type doped region 138 may be an n-type doped well region or an n-type doped substrate 126. It is understood that the doping types may be reversed, e.g., n+ doped resistor body 128 formed on a p-type doped region 138. The doping distribution or profile in the resistor body is generally non-uniform, and may have an average doping concentration in the range of $10^{16}$ to $10^{19}$ cm$^{-3}$.

The resistor body 128 shown in FIG. 3 can be defined by isolation structures 130, such as shallow trench isolation (STI) structures, for example. The resistor 124 of the present invention may have a rectangular layout with width W and a length L. The width W may have a dimension of larger than about 0.1 microns, and preferably larger than about 1 micron. In the preferred embodiment, the length L may have a dimension of larger than about 0.1 micron, and preferably larger than about 1 micron. The resistor may have a layout with a serpentine shape, or any other shape commonly used in the art for diffusion resistors.

The example in FIG. 3 illustrates a bulk semiconductor substrate 126, preferably a bulk silicon substrate. However, it is understood that other substrates such as semiconductor-on-insulator (SOI) substrates may also be used. For example, the semiconductor-on-insulator substrate can be a silicon-on-insulator substrate having a silicon layer overlying a silicon oxide layer, said silicon oxide layer overlying a substrate. The silicon layer in the silicon-on-insulator substrate may be a relaxed silicon layer or a strained silicon layer.

A cross-section of the resistor 124 in FIG. 3 shows a doped body region 128, also known as a resistor body, formed on a portion of the substrate 126. The resistor body 128 can be defined by isolation structures, such as the shallow trench isolation structures 130 shown in FIG. 3. The doping type of the doped body region 128 is opposite to the doping type of the semiconductor region 138 immediately underlying the body region 128. For example, if the resistor body 128 is doped p-type, it may be formed on an n-type well region or on an n-type substrate. The average doping concentration of the resistor body 128 may be in the range of $10^{16}$ to $10^{19}$ cm$^{-3}$. A conductive material can be formed to provide contacts 136 to the terminals of the resistor 124.

The strained channel transistor 132 of FIG. 3 comprises source and drain regions 140 on opposing sides of a channel region 164. The channel region 164, formed from a first semiconductor material 126, is covered by an overlying gate dielectric 150. A gate electrode 148 overlies the gate dielectric 150. The gate electrode 148 material can be poly-crystalline silicon, poly-crystalline silicon germanium, metals, metallic suicides, metallic nitrides, or conductive metallic oxide. Spacers 170 consisting of one or more dielectric materials are formed on the sidewalls of the gate electrode 148. A portion of the source and drain regions 140 comprise a second semiconductor material 162. The second semiconductor material 162 may have a second natural lattice constant that is different from the natural lattice constant of the first material 126. A silicide 174 overlays the gate electrode 148 and the source and drain regions 140. In contrast, the doped region constituting the resistor body 128 is not silicided to maintain a high resistance.

Principles of the present invention can also be applied to a resistor of the type taught in co-pending application Ser. No. 10/667,871, filed Sep. 22, 2003, which application is incorporated herein by reference. Using the methods taught herein, this resistor can be formed simultaneously with a strained channel transistor.

The present invention teaches a method of forming the strained channel transistor 132 on the same semiconductor substrate 126 as the conventional resistor 124 using the same fabrication or manufacturing process.

Figure 4A:
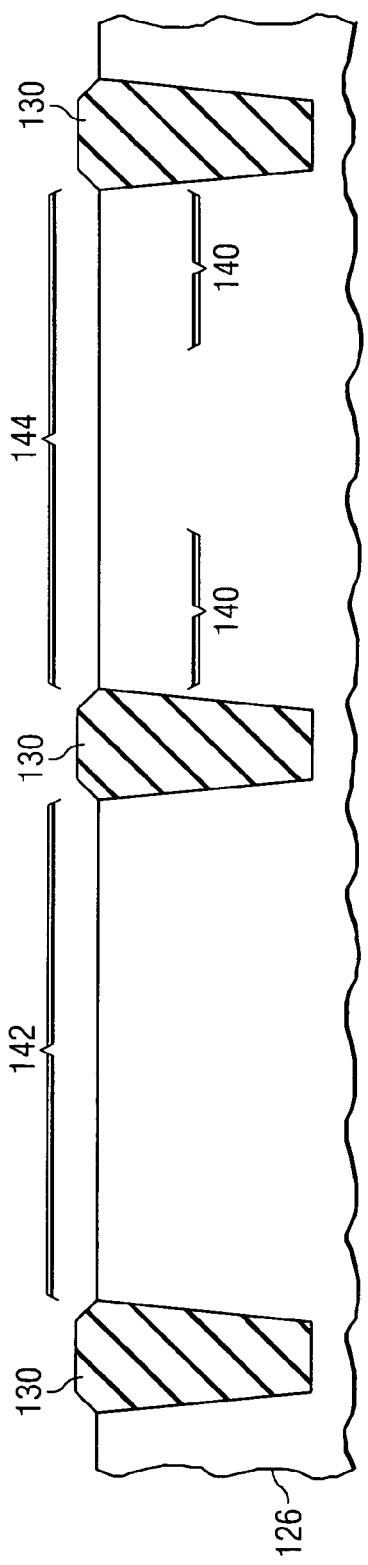

Referring now to FIG. 4a, a process flow showing the method of manufacturing a resistor with a strained channel transistor is described. A semiconductor substrate 126, preferably a silicon substrate, is provided and isolation structures 130 are formed to define active regions in the substrate. The isolation structures 130 may be formed using standard shallow trench isolation processes, for example, comprising the steps of etching trenches with depths in the range of about 2000 to about 6000 angstroms, and filling the trenches with a trench filling dielectric material by chemical vapor deposition, for example, to give the cross-section as shown in FIG. 4a. The trench filling dielectric may be silicon oxide, for example. Ion implantation may be performed to form n-type and/or p-type well regions (not shown). FIG. 4a shows two active regions: a first active region 142 where a conventional resistor 124 is to be formed, and a second active region 144 where a strained channel transistor 132 is to be formed. These active regions might be of the same conductive type as each other or they may be of different conductivity types. Source/drain regions 140 are shown in the FIG. 4a even though these regions have not been formed yet.

A gate stack 146 is then formed in the second active region 144, as shown in FIG. 4b. The gate stack 146 comprises a gate electrode 148 overlying a gate dielectric 150. The gate stack 146 may additionally comprise a gate mask 152 overlying the gate electrode 148. The purpose of incorporating the gate mask 152 will become clear below.

The gate stack may be formed by the following process. A gate dielectric 150 is formed in the second active region 144 using any gate dielectric formation process known and used in the art, e.g., thermal oxidation, nitridation, sputter deposition, or chemical vapor deposition. The physical thickness of the dielectric 150 may be in the range of about 5 to about 100 angstroms. The transistor gate dielectric 150 may employ a gate dielectric such as silicon oxide and silicon oxynitride or a high permittivity (high-k) gate dielectric, or combinations thereof.

The high-k dielectric preferably has a permittivity of larger than 8. This dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide $CeO_2$), titanium oxide ($TiO_2$), tantalum oxide ($Ta_2O_5$), or combinations thereof. In the preferred embodiment, the high-k dielectric is hafnium oxide. The silicon equivalent oxide thickness (EOT) of the dielectric 150 is preferably less than about 50 angstroms, more preferably less than about 20 angstroms, and even more preferably less than about 10 angstroms. The physical thickness of the dielectric 150 may be less than about 100 angstroms, more preferably less than about 50 angstroms, and even more preferably less than about 20 angstroms.

After the gate dielectric 150 is formed, a gate electrode material 148 can then be deposited over the gate dielectric 150 layer. The gate electrode material 148 can be poly-crystalline silicon, poly-crystalline silicon germanium, metals, metallic suicides, metallic nitrides, or conductive metallic oxide. In the preferred embodiment, the electrode 148 comprises poly-crystalline silicon. Metals such as molybdenum, tungsten, titanium, tantalum, platinum, and hafnium may be used as the portion of the top electrode 148. Metallic nitrides may include, but are not restricted to, molybdenum nitride, tungsten nitride, titanium nitride, and tantalum nitride. Metallic suicides may include, but will not be restricted to, nickel silicide, cobalt silicide, tungsten silicide, titanium silicide, tantalum silicide, platinum silicide, and erbium silicide. Conductive metallic oxides may include, but will not be restricted to, ruthenium oxide and indium tin oxide.

The gate electrode material 148 may be deposited by conventional techniques such as chemical vapor deposition. The gate electrode 148 may also be formed by the deposition of silicon and metal, followed by an annealing to form a metal silicide gate electrode material. A patterned gate mask 152 is then formed on the gate electrode 148 material using conventional deposition and photolithography techniques. The gate mask 152 may employ commonly used masking materials such as, but not limited to, silicon oxide, silicon oxynitride, and silicon nitride. The gate electrode 148 is then etched using plasma etch processes to form the gate electrode. The gate dielectric 150 on regions not covered by the gate electrode 148 is preferably etched away.

As shown in FIG. 4c, a first mask material 154 is deposited over the gate stack 146. The first mask material 154 may be a dielectric such as silicon oxide, silicon oxynitride, or silicon nitride, for example. In the preferred embodiment, the first mask material comprises a silicon nitride on silicon oxide multi-layer.

A second mask material 156 is then formed using deposition and photolithographic techniques to cover the first mask material 154 in the first active region 142, while exposing the first mask material 154 in the second active region 144 as shown in FIG. 4d. The second mask material 156 may comprise any masking material that is different from the first mask material 154. In the preferred embodiment, the second mask material 156 comprises a photoresist.

An etching of the first mask material 154 in the second active region 144 is then performed in the presence of the second mask material 156. The etching is preferably an anisotropic etch done using plasma etching techniques. This results in spacers or liners 158 being formed adjacent to the gate stack 146 in the second active region 144, as shown in FIG. 4e. The second mask material 156 may be removed at this point.

Figure 4F:
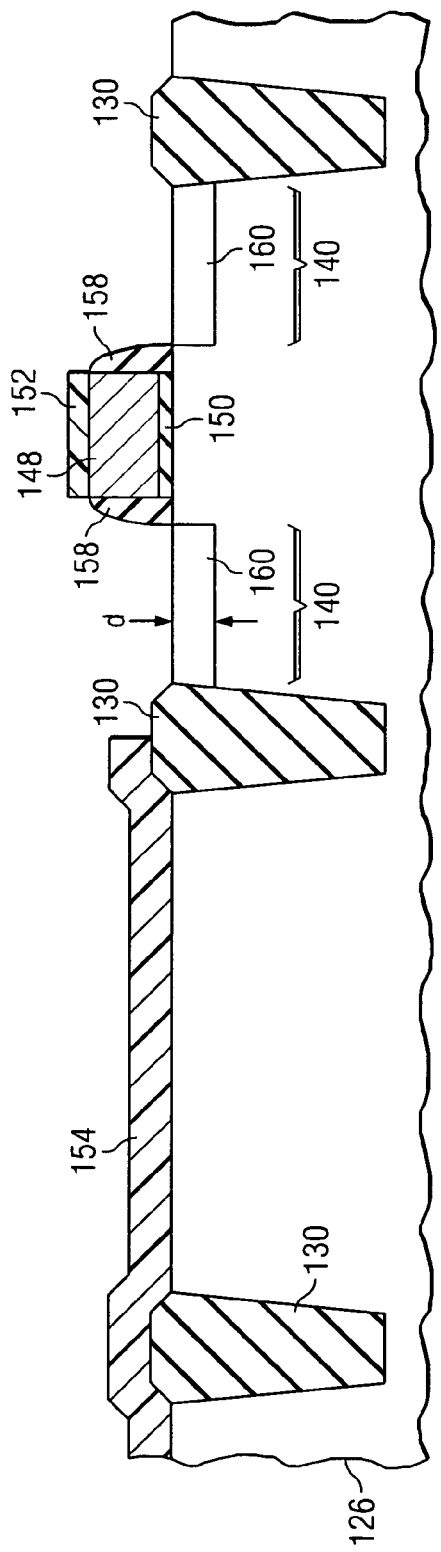

A recess with depth d is etched in the source and drain regions, as shown in FIG. 4f. The etch may be accomplished by a plasma etch using chlorine and bromine chemistry. The depth d of the recess may range from about 50 angstroms to about 1000 angstroms. An optional anneal may be performed to facilitate silicon migration to repair any etch damage as well as to slightly smoothen the silicon surface for the subsequent epitaxy process.

Next, a second semiconductor material 162 is epitaxially grown to at least partially fill the recessed region 160. This can be accomplished using selective epitaxial growth. The epitaxy process used to perform the epitaxial growth may be chemical vapor deposition, ultra-high vacuum chemical vapor deposition (UHV-CVD), or molecular beam epitaxy. The epitaxially grown materials may also extend above the surface of the channel region 164 of the transistor 132, forming a raised source and drain structure (not shown). In the first preferred embodiment, the second semiconductor material 162 comprises of silicon germanium with a germanium mole fraction between about 0.1 and about 0.9. In the second preferred embodiment, the lattice-mismatched zone is comprised of silicon-carbon with a carbon mole fraction of between about 0.01 and about 0.04.

The gate mask 152 covers the top portion of the gate electrode 148 so that no epitaxial growth occurs on the gate electrode 148. The liner 158 covers the sidewalls of the gate electrode 148 so that no epitaxial growth occurs on the sidewalls. Epitaxial growth on the gate electrode 148 sidewalls potentially results in an electrical short between the gate stack and the source and drain regions 140.

Figure 4G:
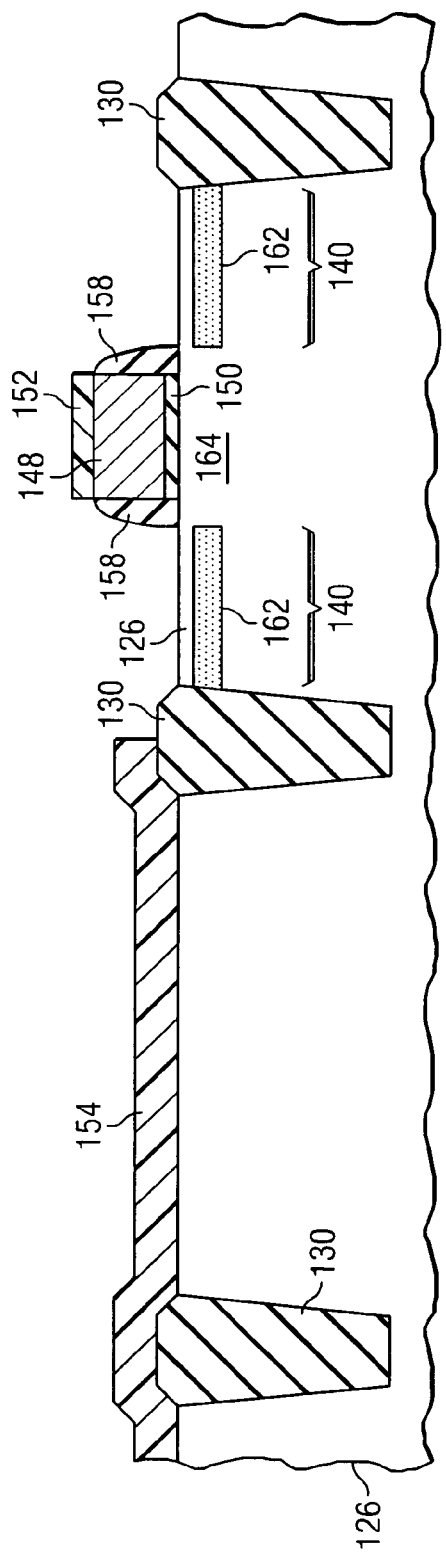

An optional cap layer may be epitaxially grown to cover the second semiconductor material 162. For example, the optional cap layer may comprise a first semiconductor material 126, as shown in FIG. 4g. The purpose of having the cap layer is to facilitate the subsequent formation of a low resistance silicide in the source and drain regions 140.

Following epitaxial growth, the gate mask 152 can be removed. The liner 158 can be optionally removed.

Figure 4H:
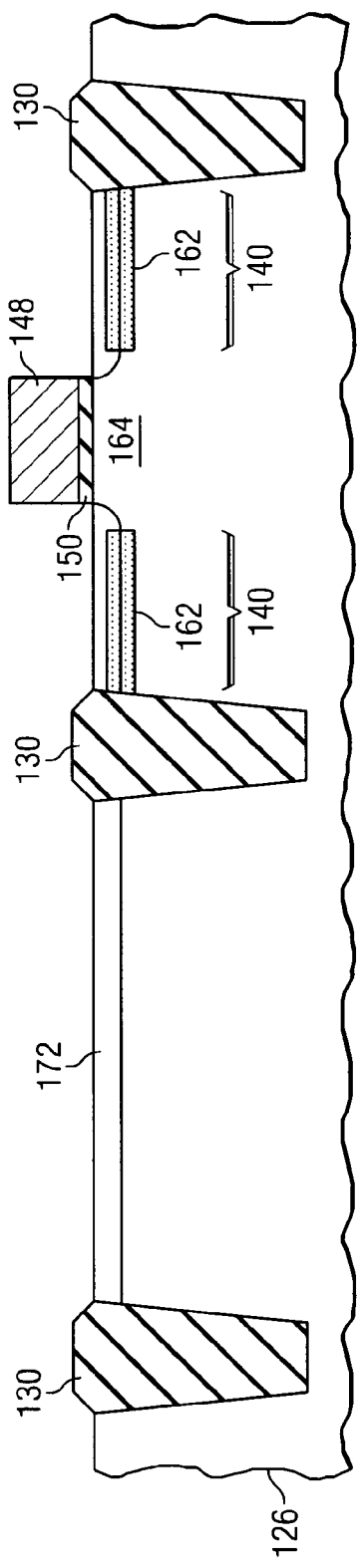

The epitaxially grown first and second semiconductor materials, 126 and 162 respectively, may be in-situ doped or undoped during the epitaxial growth. If undoped as grown, they may be doped subsequently and the dopants activated using a rapid thermal annealing process. The said dopants may be introduced by conventional ion implantation, plasma immersion ion implantation (PIII), gas or solid source diffusion, or any other techniques known and used in the art. Any implant damage or amorphization can be annealed through subsequent exposure to elevated temperatures. A first shallow implant can be first performed to dope the shallow regions of the resistor body 128 and to form the source/drain extensions, 140 of the transistor 132, as shown in FIG. 4h.

Figure 4I:
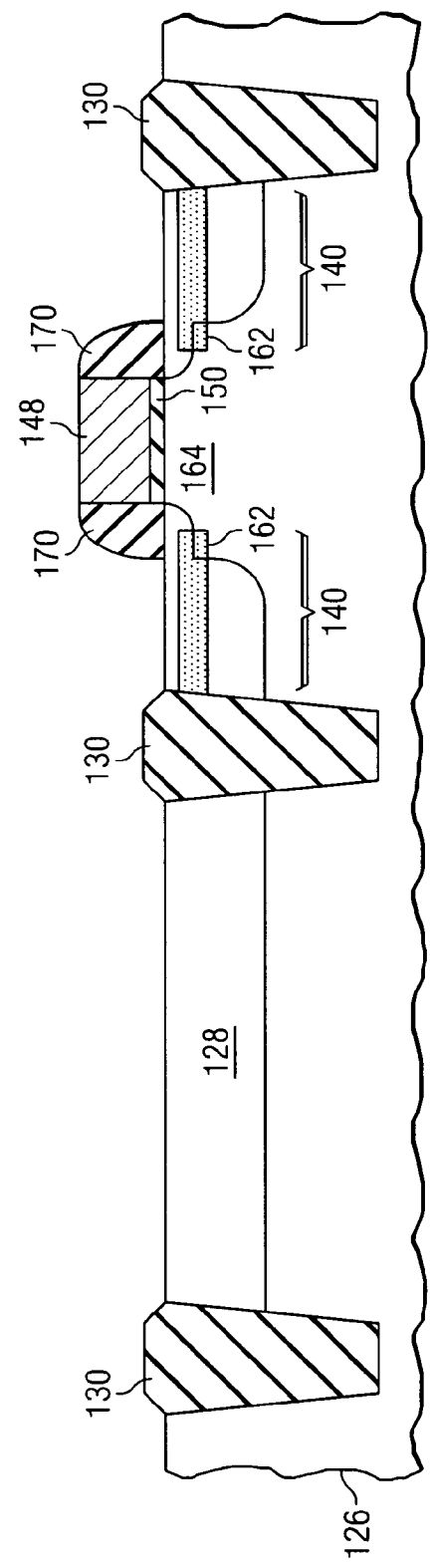

A spacer 170 is then formed, followed by a second and deeper implant. The second implant additionally dopes the resistor body 128, and also forms the deep source and drain regions 140 of the strained channel transistor 132. The structure formed at this stage is shown in FIG. 4i.

Figure 4J:
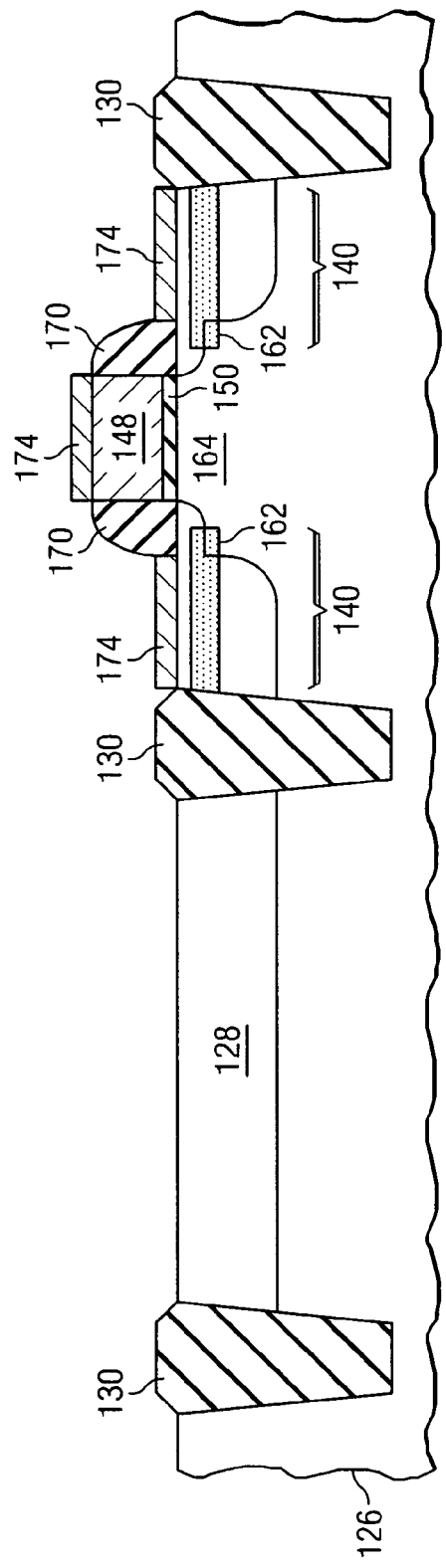

The resistance of the source and drain in the transistor can be reduced by strapping the source/drain regions 140 with a silicide 174, e.g., using a self-aligned silicide (salicide) process, or other metal deposition process. This is illustrated in FIG. 4*j*. A mask, usually comprising an oxide, is typically used prior to the silicidation process to cover portions of the substrate where silicidation is not intended. For example, the oxide mask covers the first active region 142 while exposing the second active region 144. A subsequent silicidation process therefore forms silicides 174 on the gate electrode 148, and source and drain regions 140 of the strained channel transistor 132, while no silicide is formed in the first active region 142 where the resistor 124 is located. While not shown, resistor 124 contacts can be formed by the silicidation process.

Figure 4K:
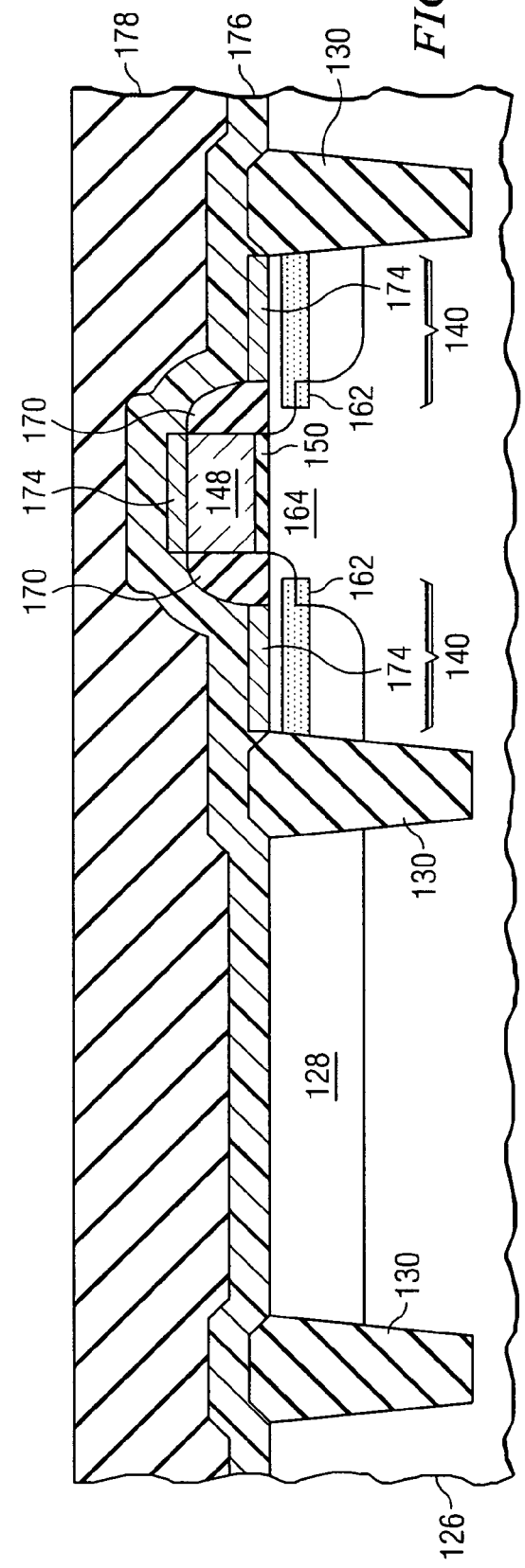

Next, a contact etch stop layer 176 may be formed, followed by the deposition of a passivation layer 178, as shown in FIG. 4*k*. Contact holes 180 are then etched through the passivation layer 178, stopping on the contact etch stop layer 176. A conductive material is then filled into the contact holes 180 to form conductive contacts to the resistor 124 and the strained channel transistor 132 as shown in FIG. 4*l*.

In the first embodiment, a resistor and strained channel transistor are integrated into a single device. In the next embodiment, a strained channel transistor is integrated into the same chip as a non-strained channel transistor. Since the use of a contact etch stop over the non-strained transistor could result in strain, in this context, a non-strained channel transistor is meant to include a transistor that is not strained using source/drain stressors.

The second embodiment will be described in the context of an integration flow is described for manufacturing an improved CMOS device. As before, the source and drain regions are etched and then refilled of silicon, geranium, carbon, or combinations thereof. The alloy is deposited on the layer of silicon by a selective epitaxy process thereby creating a stress in the channel of the transistor between the source and drain. The larger lattice spacing creates a compressive stress and the smaller one creases a tensile stress.

Compressive stress improves carrier mobility of the PMOS transistor and degrades carrier mobility of the NMOS transistor, as shown in FIGS. 5 and 6. It is an objective of certain embodiments of this invention to separate n-channel and p-channel transistors by engineering the nature and magnitude of the strain in the channel region of the transistors. It is desirable to induce a compressive strain in the channel of the p-channel transistor in the source-to-drain direction and compressive stress free of the n-channel transistor. It is also desirable to induce a tensile strain in the channel of the n-channel transistor in the source-to-drain direction and tensile stress free of the p-channel transistor.

Another preferred embodiment of the present invention teaches a method of integrating strained channel transistors of more than one conduction type with minimal degradation of carrier mobility.

Figure 7:
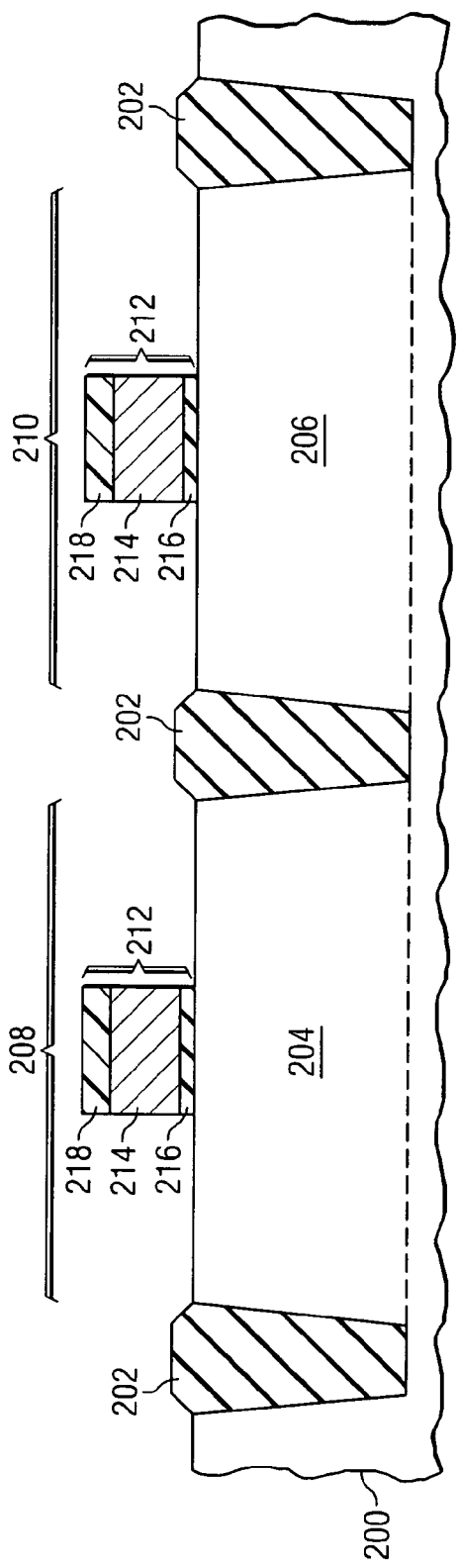

Referring now to FIG. 7, a process flow showing the method of manufacturing strained channel transistors of multiple conduction types with minimal degradation of carrier mobility is described. A semiconductor substrate 200, preferably a silicon substrate, is provided and isolation structures 202 are formed to define active regions in the substrate. The isolation structures 202 may be formed using standard shallow trench isolation (STI) processes, for example, comprising the steps of etching trenches with depths in the range of about 2000 to about 6000 angstroms, and filling the trenches with a trench filling dielectric material by chemical vapor deposition to give the cross-section as shown in FIG. 7. The trench filling dielectric 202 may be silicon oxide, for example. Ion implantation may be performed to form n-type well regions 204 or p-type well regions 206. FIG. 7 shows two active regions: a first active region 208 where a p-type strained channel transistor is to be formed, and a second active region 210 where an n-type channel transistor is to be formed.

A gate stack 212 is then formed in the first and second active regions 208/210, as shown in FIG. 7. The gate stack 212 may additionally comprise a hard mask 218 overlying the gate electrode 214. The gate stack 212 comprises a gate electrode 214 overlying a gate dielectric 216. The gate dielectric 216 is formed using any gate dielectric formation process known and used in the art, e.g., thermal oxidation, nitridation, sputter deposition, or chemical vapor deposition. The physical thickness of the gate dielectric 216 may be in the range of 5 to 100 angstroms. The gate dielectric 216 may employ a conventional gate dielectric such as silicon oxide and silicon oxynitride or a high permittivity (high-k) gate dielectric, or combinations thereof.

The high-k dielectric preferably has a permittivity of larger than 8. This dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide $CeO_2$), titanium oxide ($TiO_2$), tantalum oxide ($Ta_2O_5$), or combinations thereof. In the preferred embodiment, the high-k dielectric is hafnium oxide. The silicon equivalent oxide thickness (EOT) of the dielectric 150 is preferably less than about 50 angstroms, more preferably less than about 20 angstroms, and even more preferably less than about 10 angstroms. The physical thickness of the dielectric 150 may be less than about 100 angstroms, more preferably less than about 50 angstroms, and even more preferably less than about 20 angstroms.

After the gate dielectric 216 is formed, a gate electrode material 214 can then be deposited over the gate dielectric 216. The gate electrode material 214 can be comprised of poly-crystalline silicon, poly-crystalline silicon germanium, metals, metallic silicides, metallic nitrides, or conductive metallic oxide. In the present embodiment, the electrode 212 comprises poly-crystalline silicon. Metals such as molybdenum, tungsten, titanium, tantalum, platinum, and hafnium may be used as the portion of the top electrode 214. Metallic nitrides may include, but are not restricted to, molybdenum nitride, tungsten nitride, titanium nitride, and tantalum nitride. Metallic silicides may include, but will not be restricted to, nickel silicide, cobalt silicide, tungsten silicide, titanium silicide, tantalum silicide, platinum silicide, and erbium silicide. Conductive metallic oxides may include, but will not be restricted to, ruthenium oxide and indium tin oxide.

The gate electrode material 214 may be deposited by conventional techniques such as chemical vapor deposition. The gate electrode 214 may also be formed by the deposition of silicon and metal, followed by an annealing to form a metal silicide gate electrode material. A patterned hard mask 218 is then formed on the gate electrode 214 material using deposition and photolithography techniques. The gate mask 218 may employ commonly used masking materials such as, but not limited to, silicon oxide, silicon oxynitride, and silicon nitride. The gate electrode 214 is then etched using plasma etch processes to form the gate electrode. The gate dielectric 216 on regions not covered by the gate electrode 214 is preferably etched away.

Figure 8:
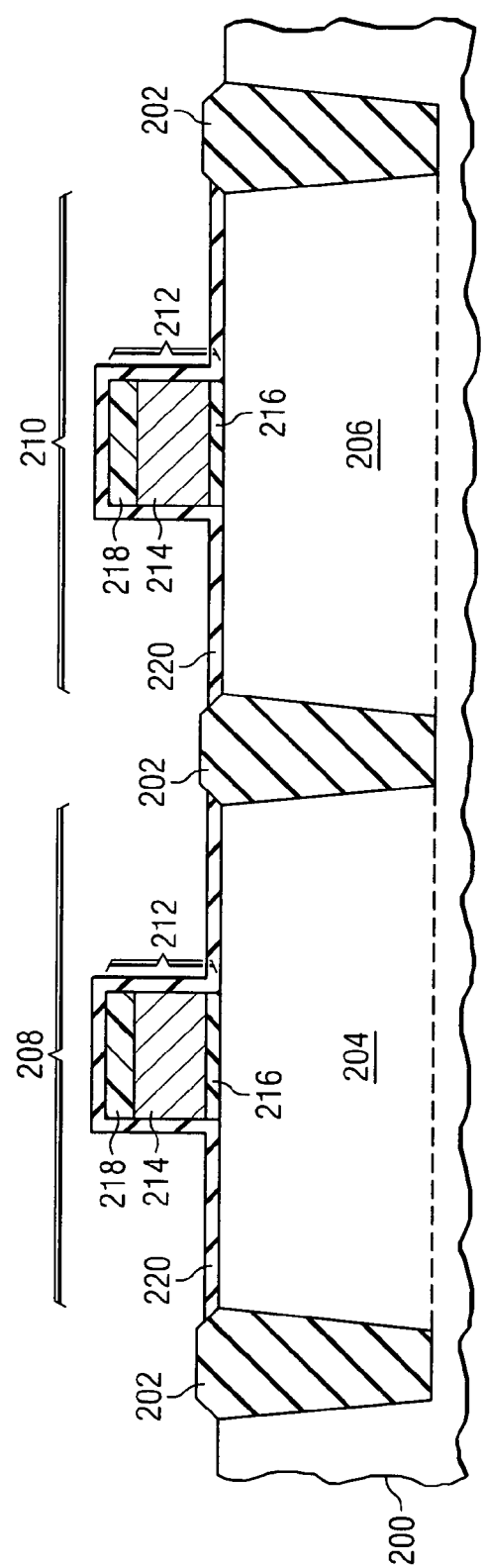

As shown in FIG. 8, a disposable film 220 is formed over the first and second active regions 208/210. The disposable film may be a dielectric film formed using a chemical vapor deposition process or sputter deposition. The disposable film may comprise oxide, for example. In the preferred embodiment, the disposable film 220 is between about 10 and about 1000 angstroms thick, and more preferably between about 10 and about 200 angstroms thick.

Figure 9:
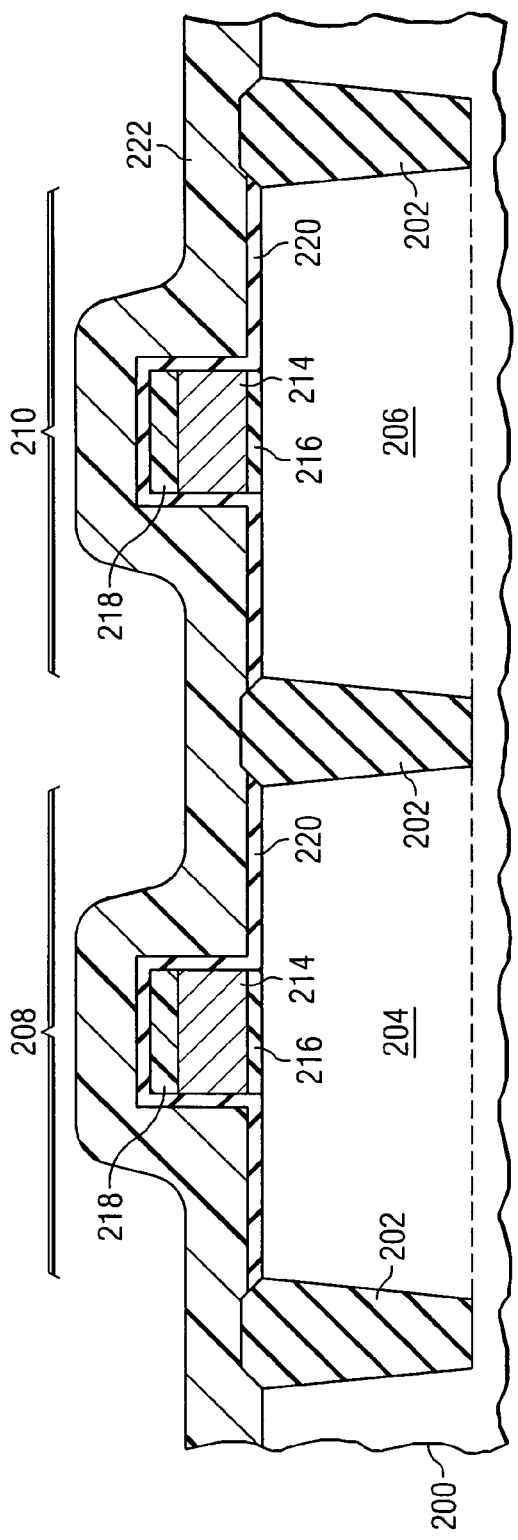

A first mask material 222 shown in FIG. 9 is deposited over the first and second active regions 208/210 may be silicon oxide, silicon oxynitride, or silicon nitride. In the preferred embodiment, the first mask material comprises a silicon nitride on a silicon oxide multi-layer.

Figure 10:
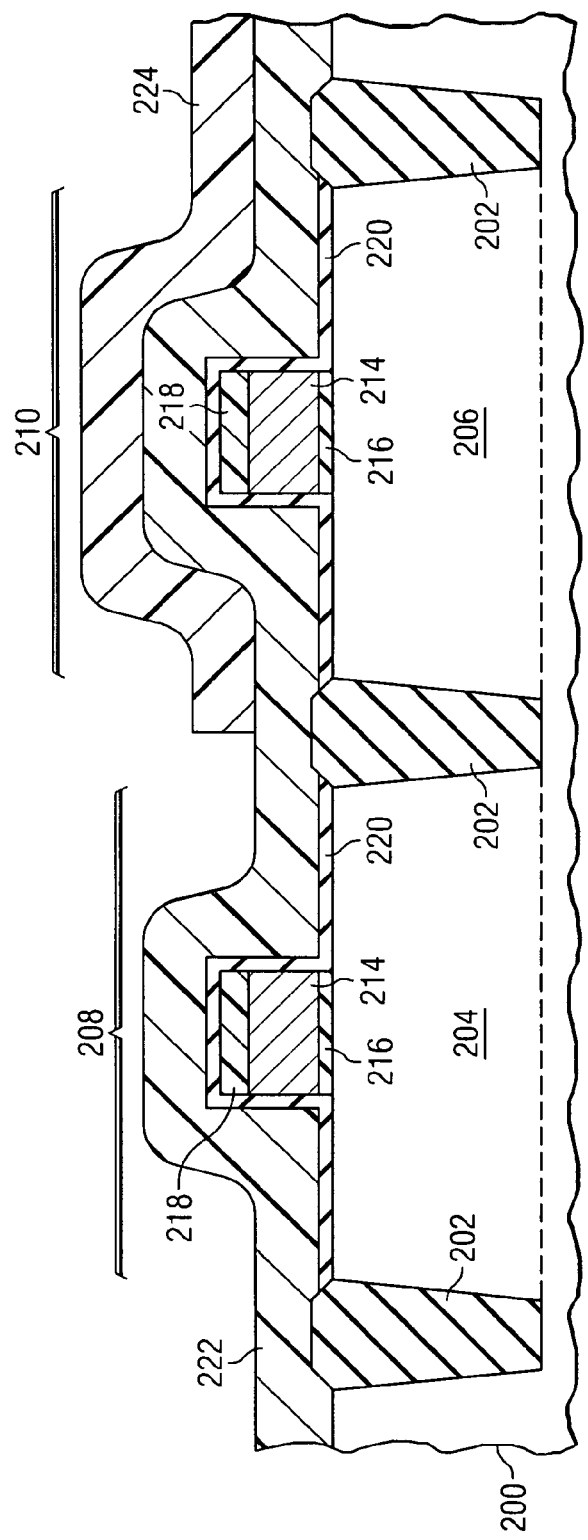

FIG. 10 shows a second mask material 224 formed over the second active region 210 using deposition and photolithographic techniques to cover the first mask material 222 in the second active region 210, while exposing the first mask material 222 in the first active region 208 of FIG. 10. The second mask material 224 may comprise any masking material that is different from the first mask material 222. In the preferred embodiment, the second mask material comprises a photoresist.

An etching of the first mask material 222 in the second active region 210 is then performed in the presence of the second mask material 224. The etching is preferably an anisotropic etch done using plasma etching techniques. This results in disposable spacers or liners 226 being formed adjacent to the gate stack 212 in the first active region 208, as shown in FIG. 11.

After the disposable spacers 226 are formed, recessed regions 228 are etched in the active area substantially aligned with the disposable spacers 226. A silicon etch chemistry can be used as discussed above. The second mask material 224 may be removed after etching.

Next, as shown in FIG. 12, second semiconductor material 230 is epitaxially grown to at least partially fill the recessed region 228. This can be accomplished using selective epitaxial growth (SEG). The epitaxy process used to perform the epitaxial growth may be chemical vapor deposition (CVD), ultra-high vacuum chemical vapor deposition (UHV-CVD), or molecular beam epitaxy (MBE). The epitaxially grown materials may also extend above the surface of the channel region 232 of the second active region 210, forming a raised source and drain 230 structure as shown in FIG. 12. In the second preferred embodiment, the second semiconductor material 230 comprises of silicon germanium with a germanium mole fraction between about 0.1 and about 0.9. In the second preferred embodiment, the lattice-mismatched zone is comprised of silicon-carbon with a carbon mole fraction of between about 0.01 and about 0.04.

The gate mask 218 covers the top portion of the gate electrode 214 so that no epitaxial growth occurs on the gate electrode 214. The disposable liner 226 prevents epitaxial growth on the gate electrode 214 sidewalls.

Figure 13:
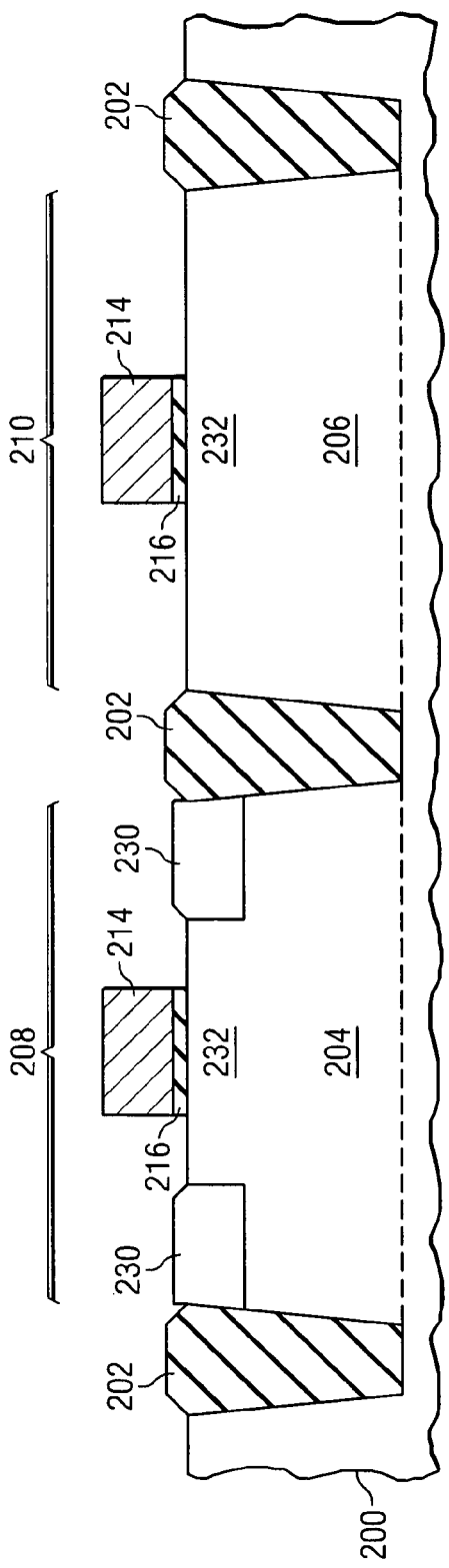
FIGS. 13-14 show additional steps of the second embodiment.

Following epitaxial growth, the gate mask 218, disposable liner 226, and first mask material can be removed, forming the structure shown in FIG. 13.

The epitaxially grown first 200 semiconductor materials may be in-situ doped or undoped during the epitaxial growth. If undoped as grown, it may be doped subsequently and the dopants activated using a rapid thermal annealing process. The dopants may be introduced by conventional ion implantation, plasma immersion ion implantation (PIII), gas or solid source diffusion, or any other techniques known and used in the art. Any implant damage or amorphization can be annealed through subsequent exposure to elevated temperatures.

Figure 14:
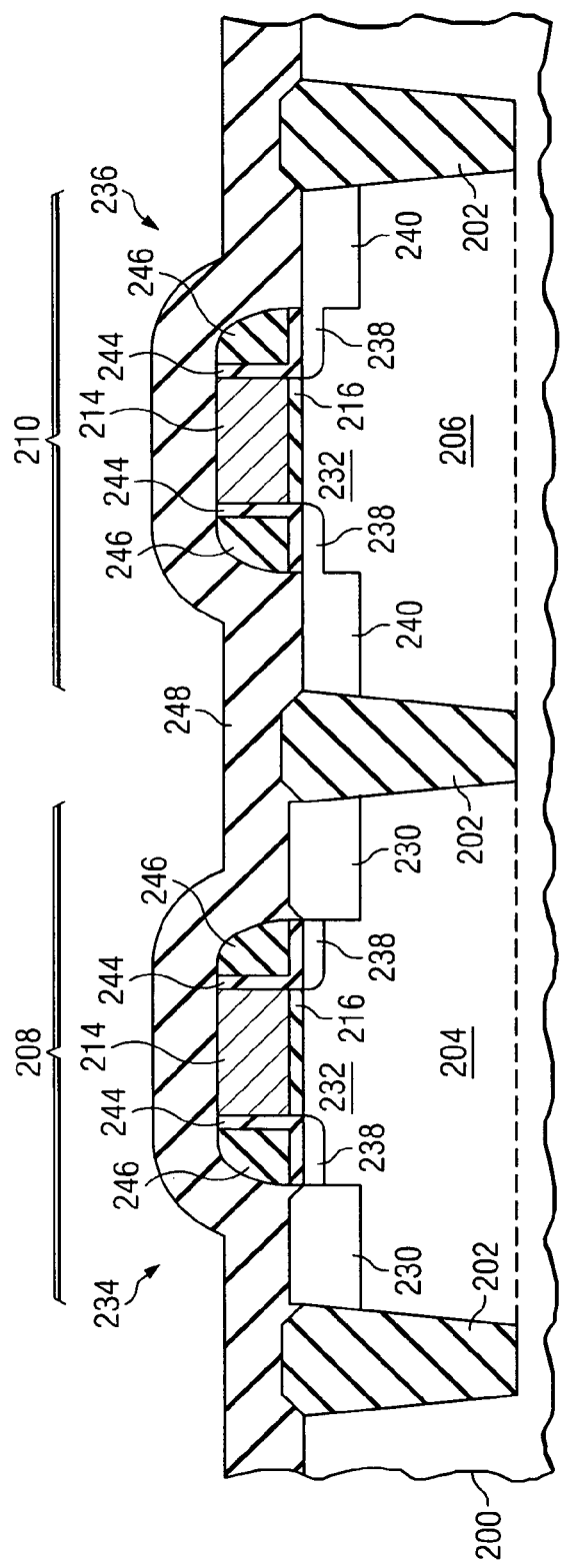

FIG. 14 shows the semiconductor device after further processing. A first shallow implantation can be performed on the structure of FIG. 14 to dope the shallow regions of the first and second transistor source and drain regions and to form the source/drain extensions, as shown in FIG. 14.

Spacers (including regions 244 and 246) are formed on the sides of the gate electrode 214. In one example, the spacers may be formed by chemical vapor deposition of a dielectric material, e.g., silicon oxide or silicon nitride, followed by an anisotropic etching of the dielectric material to form simple spacers. In the example of FIG. 14, the spacers are composite spacers. A composite spacer may comprise a dielectric liner 244 and a spacer body 246. The dielectric liner 244 may be formed by the deposition of a dielectric liner material, e.g., silicon oxide, and the spacer body material 246, e.g. silicon nitride, followed by an anisotropic etch using reactive ion etching. In another embodiment, the liner 244 may be an oxide and the spacer body 246 may be a nitride.

The source and drain regions for the first transistor 236 are formed using ion implantation while covering the second transistor 234. In the preferred embodiment, the dopant is arsenic or phosphorus or a combination of both. The source and drain regions for the second transistor 234 formed by using ion implantation while covering the first transistor 236. In the preferred embodiment, a dopant such as boron is used. A passivation layer 248 is formed over the first and second active regions 208/210.

Figure 15:
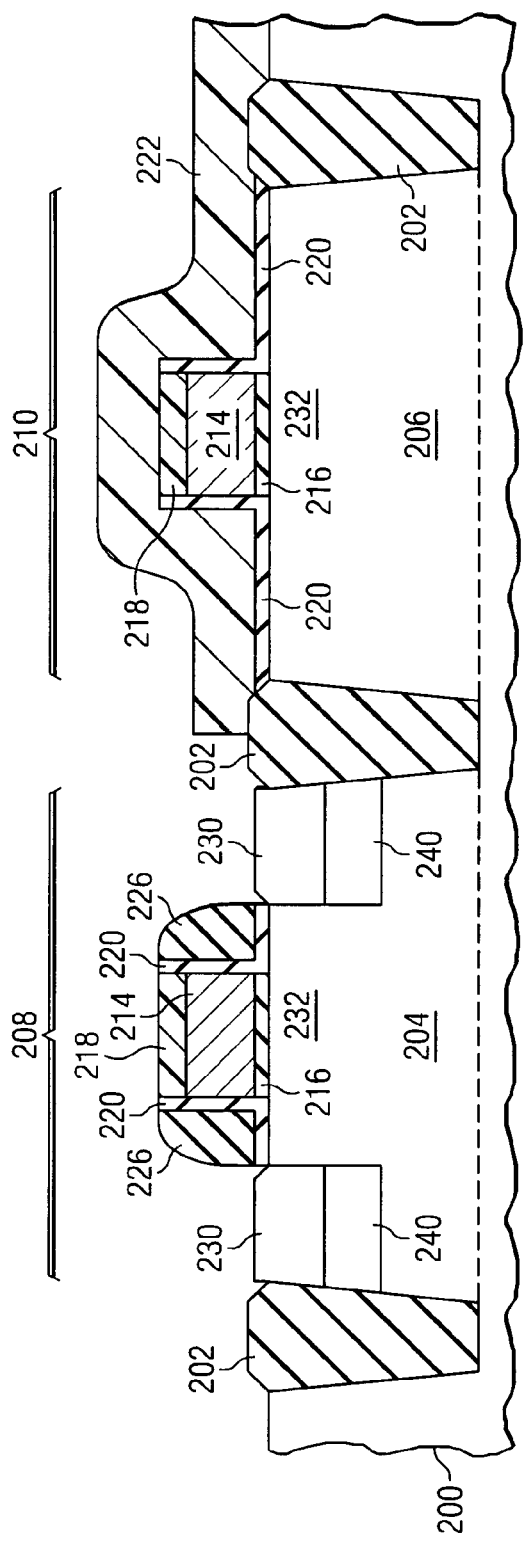
FIGS. 15-19 show additional steps of the third embodiment.

A third embodiment of the present invention will now be described with respect to FIGS. 15-19. FIG. 15 shows the structure of FIG. 12 after further processing. In particular, a source/drain implantation step has been performed as described above. In this case, the implanted dopants extend through the second semiconductor material 230 into the first well region 204. In this case, the source/drain regions include second semiconductor material 230 as well as the doped portion 240 of the first semiconductor material 200.

Figure 16:
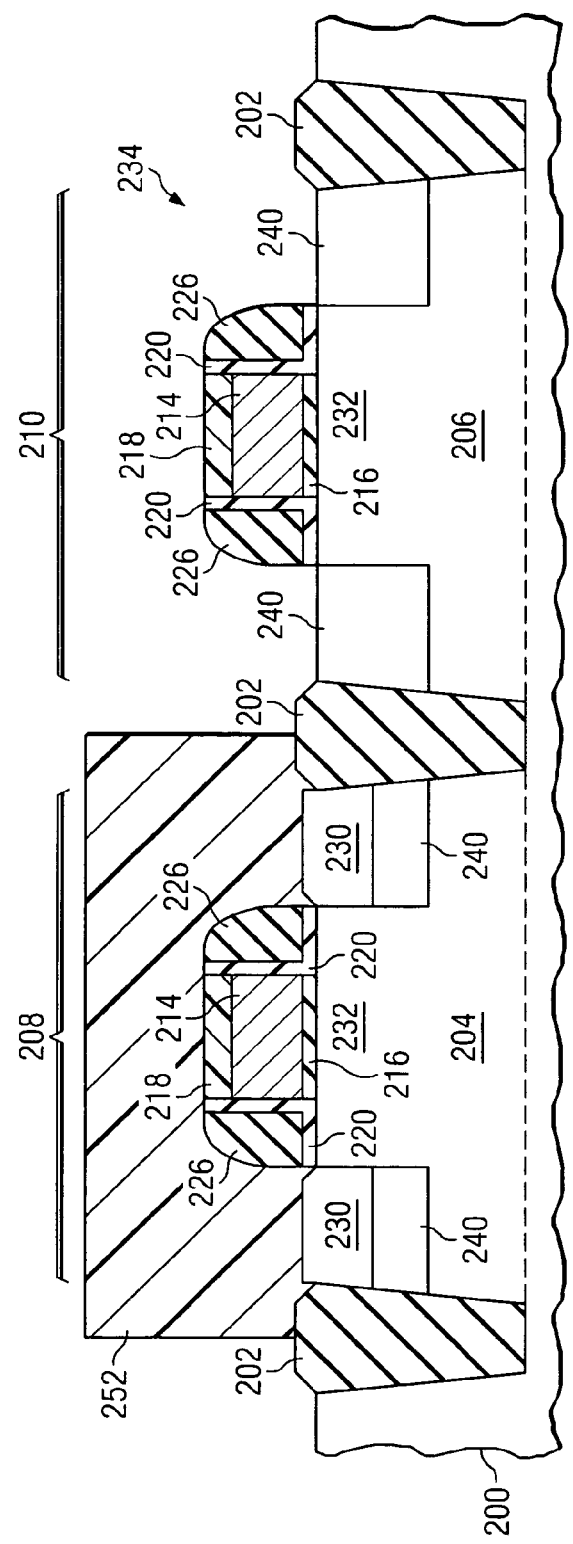

A third protective layer 252 shown in FIG. 16, preferably a photoresist, is then formed using deposition and photolithographic techniques to cover the first active area 208 while exposing the second active area 210. An etching of the first mask material 222 in the second active region 210, as described above, results in disposable spacers 226 being formed adjacent to the gate stack 212 in the second active region 210, as shown in FIG. 16.

Figure 17:
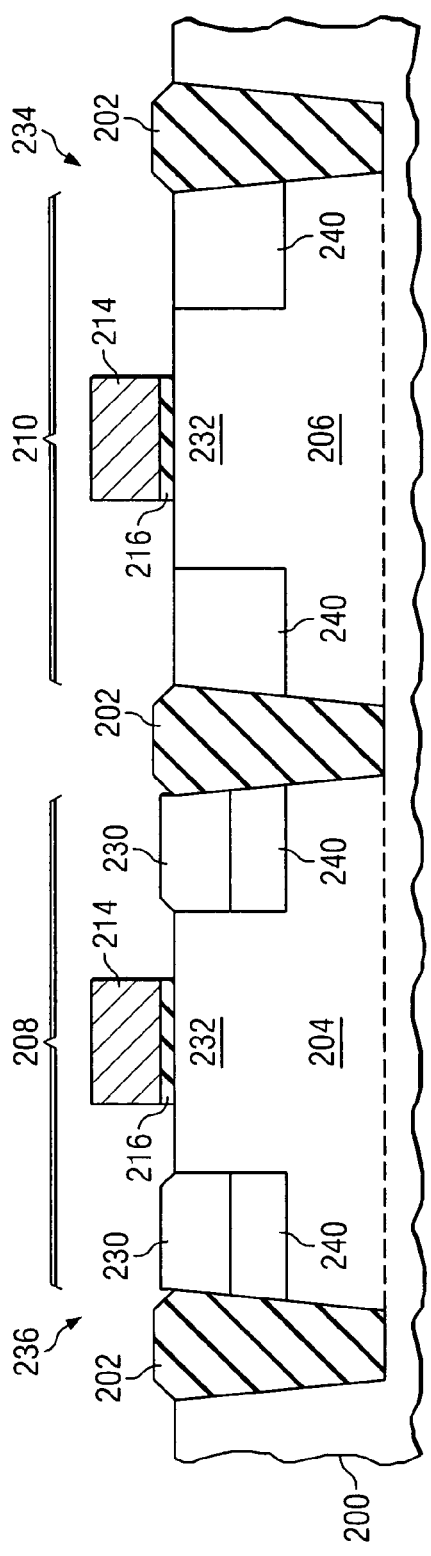

Doped regions 240 in the first semiconductor material 200 are formed using doping methods described above. Any implant damage or amorphization can be annealed through subsequent exposure to elevated temperatures. Following a deep implant and the removal of the spacers 226 of the first and second transistors 236/234, an additional shallow implant can be performed to dope the source and drain extension regions 238 of the first and second transistors 236/234. The resulting structure is shown in FIG. 17.

Figure 18:
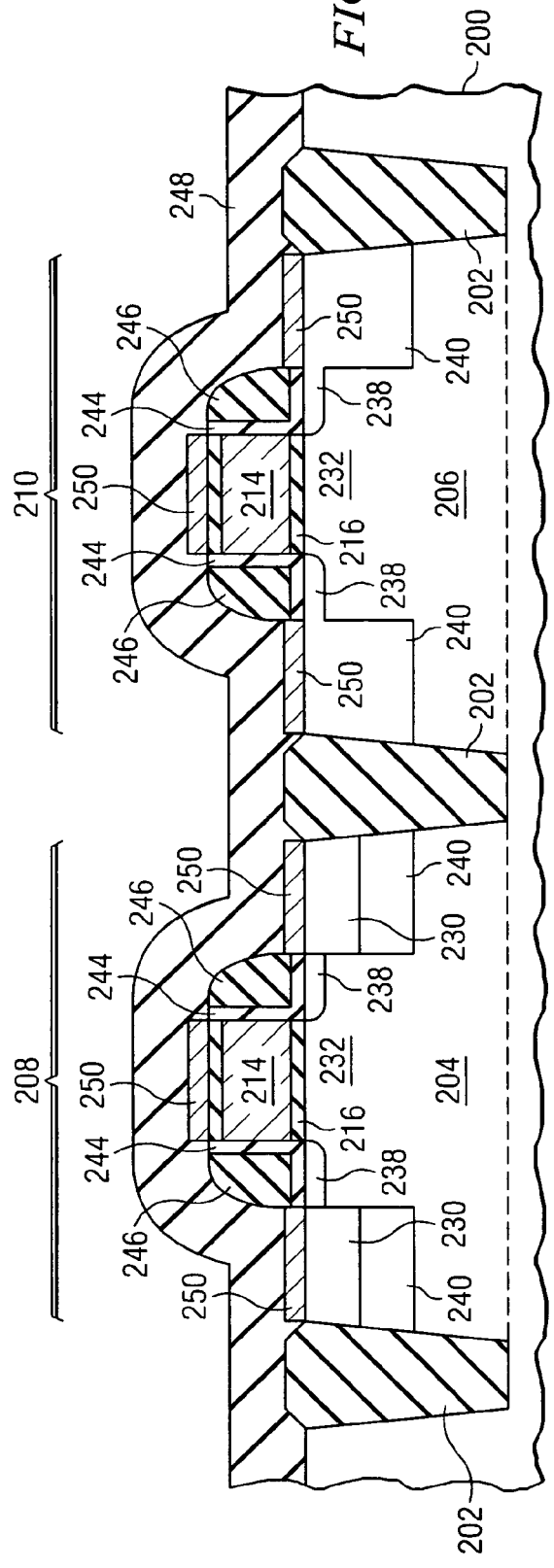

FIG. 18 shows the semiconductor device after further processing. Additional steps may include forming a liner 244 and a spacer 246 on the sides of the gate stacks 212 for the first and second transistors 236/234, and forming an etch stop layer 248 covering the first and second transistors 236/234.

Figure 19:
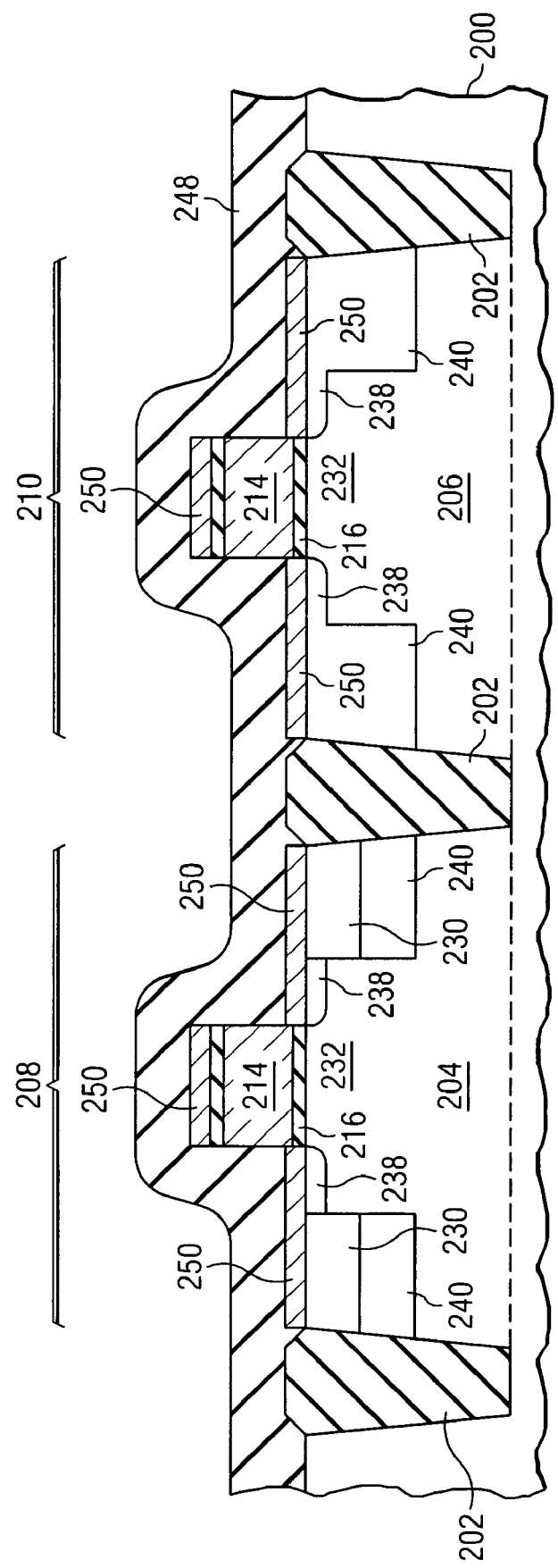

FIG. 19 shows an alternate embodiment where the spacers 244/246 have been eliminated. One purpose of the spacers in an embodiment such as shown in FIG. 14, for example, is to mask the source/drain extensions (e.g., lightly doped drain) during formation of the heavily doped source and drain region. As shown in FIGS. 16 and 17, however, the heavily doped source and drain regions 240 are formed prior to the formation of extensions 238. Accordingly, the spacers are not needed for this purpose. In another embodiment not shown, spacers or other sidewall lines can be included that do not align with the heavily doped source and drain regions 240.

The resistance of the gate, source and drain of the first and second transistors 236/234 can be reduced by strapping the gate electrode 214, and source and drain regions 230/240 with a silicide 250, e.g., using a self-aligned silicide (salicide) process, or other metal deposition process. These silicided regions are shown in FIG. 18.

In the two embodiments described, a strained channel transistor is formed in the same substrate as a resistor and another transistor. In another embodiment, all three components can be formed in the same substrate.

In other embodiments, other components can be formed with the strained channel transistor. For example, a capacitor is described in a pending application Ser. No. 10/627,218, filed Jul. 25, 2003. In another example, a diode or lubistor is described in a co-pending application Ser. No. 10/628,020, filed Jul. 25, 2003. Both of these applications are incorporated herein by reference. Using the concepts taught herein, any of the structures taught in the co-pending applications can be formed in the same substrate as the strained channel transistor.

In the foregoing specification, the invention has been described with reference to specific embodiments. However, various modifications and changes can be made by one skilled in the art without departing from the scope of the preferred embodiment. Accordingly, the specification and figures are to be regarded in an illustrative rather than a restrictive sense, and all such modifications are intended to be included within the scope of the preferred embodiment.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
a semiconductor substrate;
a first active region disposed in the substrate;
a second active region disposed in the substrate;
a resistor formed in the first active region, the resistor including a doped region formed between two terminals;
a strained channel transistor formed in the second active region, the strained channel transistor including first and second stressors formed in the substrate oppositely adjacent a strained channel region, wherein the first and second stressors extend into the substrate from a surface of the substrate; and
a layer over the resistor and the strained channel transistor, the layer in contact wth the resistor.

2. The semiconductor chip of claim 1, wherein the doped region has a doping type that is opposite to a doping type of a portion of the semiconductor substrate underlying the doped region.

3. The semiconductor chip of claim 1, wherein the doped region has a doping concentration in the range of about $10^{16}$ to about $10^{19}$ cm$^{-3}$.

4. The semiconductor chip of claim 1, wherein the doped region has an n-type doping.

5. The semiconductor chip of claim 1, wherein the doped region has a p-type doping.

6. The semiconductor chip of claim 1, wherein the semiconductor substrate comprises a semiconductor-on-insulator substrate.

7. A semiconductor chip comprising:
a semiconductor substrate;
a first active region disposed in the substrate;
a second active region disposed in the substrate;
a resistor formed in the first active region, the resistor including a doped region formed between two terminals; and
strained channel transistor formed in the second active region, the strained channel transistor including a gate dielectric and a strained channel region having a first lattice constant and first and second stressors having a second lattice constant that is different from the first lattice constant formed in the substrate oppositely adjacent the strained channel region and adjacent to a major surface of the semiconductor substrate, the major surface of the semiconductor substrate in contact with the gate dielectric; and
a contact etch stop layer over the resistor and the strained channel transistor, the contact etch stop layer sharing an interface with the resistor.

8. The semiconductor chip of claim 7, wherein the second lattice constant is larger than the first lattice constant.

9. The semiconductor chip of claim 7, wherein the first strained channel region comprises silicon and the first and second stressors comprise silicon and germanium.

10. The semiconductor chip of claim 9, wherein the strained channel transistor is a p-channel transistor.

11. The semiconductor chip of claim 7, wherein the second lattice constant is smaller than the first lattice constant.

12. The semiconductor chip of claim 7, wherein the strained channel region is silicon and the first and second stressors comprise silicon and carbon.

13. The semiconductor chip of claim 12, wherein the strained channel transistor is an n-channel transistor.

14. The semiconductor chip of claim 7, wherein the doped region has a doping type that is opposite to a doping type of a portion of the semiconductor substrate underlying the doped region.

15. The semiconductor chip of claim 7, wherein the doped region has a doping concentration in the range of about $10^{16}$ to about $10^{19}$ cm$^{-3}$.

16. The semiconductor chip of claim 7, wherein the doped region has an n-type doping.

17. The semiconductor chip of claim 7, wherein the doped region has a p-type doping.

18. A semiconductor chip comprising:
a semiconductor substrate;
a first active region disposed in the substrate;
a second active region disposed in the substrate;
a resistor formed in the first active region, the resistor including a doped region formed between two terminals; and
a strained channel transistor formed in the second active region, the strained channel transistor including a gate stack comprising a gate dielectric and a gate electrode, spacers formed oppositely adjacent the gate stack, and first and second stressors formed in the substrate oppositely adjacent a strained channel region, the first and second stressors extending at least to a major surface of the substrate, the major surface of the substrate sharing an interface with the gate dielectric;
wherein a surface of the substrate in the first active region is substantially clear of the gate dielectric.

19. The semiconductor chip of claim 18, wherein the gate dielectric comprises a high permittivity dielectric selected from the group consisting of aluminum oxide, hafnium oxide, hafnium oxynitride, hafnium silicate, zirconium oxide, zirconium oxynitride, zirconium silicate, yttrium oxide, lanthanum oxide, cerium oxide, titanium oxide, tantalum oxide, and combinations thereof.

20. The semiconductor chip of claim 18, wherein the gate electrode comprises a material selected from the group consisting of poly-crystalline silicon, poly-crystalline silicon-germanium, a metal, a metallic nitride, a metallic silicide, a metallic oxide, and combinations thereof.

* * * * *

UNITED STATES PATENT AND TRADEMARK OFFICE
CERTIFICATE OF CORRECTION

PATENT NO. : 7,646,068 B2  
APPLICATION NO. : 11/483913  
DATED : January 12, 2010  
INVENTOR(S) : Ko et al.

It is certified that error appears in the above-identified patent and that said Letters Patent is hereby corrected as shown below:

On the Title Page, Item (56) References Cited, OTHER PUBLICATIONS, 1st entry, delete "660-682" and insert --660-662--.
On the Title Page, Item (56) References Cited, U.S. PATENT DOCUMENTS, Page 2, Column 2, 7th entry, delete "B1" and insert --B2--.
On the Title Page, Item (56) References Cited, U.S. PATENT DOCUMENTS, Page 2, Column 2, 40th entry, delete "Leibowitz" and insert --Laibowitz--.
On the Title Page, Item (56) References Cited, OTHER PUBLICATIONS, Page 3, Column 1, 2nd entry, delete "SI" and insert --Si--.
On the Title Page, Item (56) References Cited, OTHER PUBLICATIONS, Page 3, Column 1, 5th entry, delete "Paper" and insert --Papers--.
On the Title Page, Item (56) References Cited, OTHER PUBLICATIONS, Page 3, Column 1, 10th entry, delete "878" and insert --578--.
On the Title Page, Item (56) References Cited, OTHER PUBLICATIONS, Page 3, Column 1, 13th entry, delete "286" and insert --265--.
On the Title Page, Item (56) References Cited, OTHER PUBLICATIONS, Page 3, Column 1, 14th entry, delete "Schoppen" and insert --Schuppen--.
On the Title Page, Item (56) References Cited, OTHER PUBLICATIONS, Page 3, Column 2, 10th entry, delete "SI" and insert --Si--.
On the Title Page, Item (56) References Cited, OTHER PUBLICATIONS, Page 3, Column 2, 15th entry, delete "SI/SI" and insert --Si/Si--.
In Col. 1, line 28, delete "10/667,871" and insert --7,071,052 B2--.
In Col. 1, line 28, delete "-" and insert --July 4, 2006--.
In Col. 1, line 29, delete "-" and insert --Abandoned--.
In Col. 1, line 32, delete "-" and insert --Abandoned--.
In Col. 5, line 9, delete "x" and insert --$x$--.
In Col. 5, line 14, delete "y" and insert --$y$--.
In Col. 5, line 48, delete "W" and insert --$W$--.
In Col. 5, line 49, delete "L" and insert --$L$--.
In Col. 5, line 49, delete "W" and insert --$W$--.
In Col. 5, line 51, delete "L" and insert --$L$--.
In Col. 6, line 18, delete "suicides" and insert --silicides--.

Signed and Sealed this

Twenty-second Day of June, 2010

David J. Kappos  
*Director of the United States Patent and Trademark Office*

CERTIFICATE OF CORRECTION (continued)
U.S. Pat. No. 7,646,068 B2

In Col. 7, line 29, delete "suicides" and insert --silicides--.
In Col. 7, line 36, delete "suicides" and insert --silicides--.
In Col. 8, line 9, delete "d" and insert --*d*--.
In Col. 8, line 12, delete "d" and insert --*d*--.
In Col. 14, line 10, claim 7, delete "and".
In Col. 14, line 11, claim 7, before strained insert --a--.
In Col. 14, line 26, claim 9, delete "first".